US010229935B2

(12) United States Patent
Seo et al.

(10) Patent No.: US 10,229,935 B2
(45) Date of Patent: Mar. 12, 2019

(54) CURVED DISPLAY DEVICE HAVING PLURALITY OF SUBPIXEL ELECTRODES FORMED IN PLURALITY OF COLUMNS

(71) Applicant: Samsung Display Co., Ltd., Yongin, Gyeonggi-Do (KR)

(72) Inventors: O Sung Seo, Seoul (KR); Hyun-Ho Kang, Ansan-si (KR); Young Goo Song, Asan-si (KR); Seung Jun Yu, Suwon-si (KR); Ha Won Yu, Suwon-si (KR); Ki Kyung Youk, Bucheon-si (KR); Sang Myoung Lee, Seoul (KR); Tae Kyung Yim, Seoul (KR)

(73) Assignee: Samsung Display Co., Ltd. (KR)

( * ) Notice: Subject to any disclaimer, the term of this patent is extended or adjusted under 35 U.S.C. 154(b) by 107 days.

(21) Appl. No.: 14/691,450

(22) Filed: Apr. 20, 2015

(65) Prior Publication Data

US 2016/0109763 A1    Apr. 21, 2016

(30) Foreign Application Priority Data

Oct. 16, 2014    (KR) ........................ 10-2014-0139795

(51) Int. Cl.
*G02F 1/1343* (2006.01)
*G02F 1/1335* (2006.01)
*H01L 27/12* (2006.01)
*G02F 1/1337* (2006.01)

(52) U.S. Cl.
CPC .... *H01L 27/1225* (2013.01); *G02F 1/133707* (2013.01); *G02F 1/134336* (2013.01); *G02F 2001/134345* (2013.01)

(58) Field of Classification Search
CPC ............ G02F 1/134309; G02F 1/1368; G02F 1/134336; G02F 1/136286
See application file for complete search history.

(56) References Cited

U.S. PATENT DOCUMENTS 7,515,326 B2 *   4/2009   Selbrede ................ G02B 26/02
                                                     359/290
8,035,787 B2 *  10/2011   Jung ................... G02F 1/133753
                                                     349/139
8,599,345 B2    12/2013   Inoue et al.
                          (Continued)

FOREIGN PATENT DOCUMENTS

KR    10-2012-0087439    8/2012
KR    10-2013-0125638   11/2013

*Primary Examiner* — Anh D Mai
(74) *Attorney, Agent, or Firm* — Innovation Counsel LLP

(57) ABSTRACT

A display device according to an exemplary embodiment of the present inventive concept includes: a first insulation substrate; a thin film transistor disposed on the first insulation substrate; a pixel electrode coupled to the thin film transistor; a second insulation substrate facing the first insulation substrate; and a common electrode disposed on the second insulation substrate. The pixel electrode includes a first subpixel electrode including a first vertical stem portion and a first horizontal stem portion that is disposed perpendicular to the first vertical stem portion at an end of the first vertical stem portion, and a second subpixel electrode including a second vertical stem portion and a second horizontal stem portion that is disposed perpendicular to the second vertical stem portion at an end of the second vertical step portion.

20 Claims, 19 Drawing Sheets

(56) References Cited

U.S. PATENT DOCUMENTS

| | | | |
|---|---|---|---|
| 2003/0193625 A1* | 10/2003 | Yoshida | G02F 1/1393 349/43 |
| 2015/0009465 A1* | 1/2015 | Park | G02F 1/133707 349/139 |
| 2015/0029449 A1* | 1/2015 | Woo | G02F 1/133512 349/110 |
| 2016/0077388 A1* | 3/2016 | Lee | G02F 1/133707 349/145 |
| 2016/0109768 A1* | 4/2016 | Yu | H01L 27/1225 257/72 |
| 2016/0109769 A1* | 4/2016 | Seo | G02F 1/133753 349/43 |
| 2016/0195786 A1* | 7/2016 | Son | G02F 1/13624 349/43 |
| 2016/0202575 A1* | 7/2016 | Youk | G02F 1/134336 349/110 |
| 2016/0202579 A1* | 7/2016 | Kim | G02F 1/136209 349/44 |
| 2016/0202581 A1* | 7/2016 | Yu | G02F 1/134309 257/72 |
| 2016/0209700 A1* | 7/2016 | Bae | G02F 1/133377 |
| 2016/0274409 A1* | 9/2016 | Kang | G02F 1/133512 |
| 2016/0299388 A1* | 10/2016 | Lee | G02F 1/134309 |

* cited by examiner

CURVED DISPLAY DEVICE HAVING PLURALITY OF SUBPIXEL ELECTRODES FORMED IN PLURALITY OF COLUMNS

CROSS-REFERENCE TO RELATED APPLICATION

This application claims priority to and the benefit of Korean Patent Application No. 10-2014-0139795 filed in the Korean Intellectual Property Office on Oct. 16, 2014, the entire contents of which are incorporated herein by reference.

BACKGROUND (a) Field

The present inventive concept relates to a display device.

(b) Description of the Related Art

In general, as one of the most widely used displays at present, a liquid crystal display (LCD) includes two display panels on which field generating electrodes such as a pixel electrode and a common electrode are respectively formed, and a liquid crystal layer interposed between the two display panels.

The LCD displays an image by generating an electric field on a liquid crystal layer by applying a voltage to the field generating electrodes, determining alignment directions of liquid crystal molecules of the liquid crystal layer through the generated field, and controlling polarization of incident light.

A size of the LCD is becoming larger since it is used as a display of a television receiver.

As such, as the size of the LCD becomes larger, a significant difference in visual images is observed by a viewer depending on whether a center portion or left/right ends of a screen is viewed.

To compensate such a difference in visual images, the display device can be concavely or convexly curved.

The display device may be a portrait type of display device with its vertical length longer than its horizontal length and curved in a vertical direction, or a landscape type of display device with its vertical length shorter than its horizontal length and curved in a horizontal direction.

As such, when the display device is bent to produce a curved display, texture and decreased luminance occur due to misalignment of upper and lower substrates.

The above information disclosed in this Background section is only for enhancement of understanding of the background of the inventive concept and therefore it may contain information that does not form the prior art.

SUMMARY

The present inventive concept has been made in an effort to suppress texture and dark areas that can occur in a display device, and particularly to provide improved luminance to the display device.

An exemplary embodiment of the present inventive concept provides a display device including: a first insulation substrate; a thin film transistor disposed on the first insulation substrate; a pixel electrode coupled to the thin film transistor; a second insulation substrate facing the first insulation substrate; and a common electrode disposed on the second insulation substrate. The pixel electrode includes a first subpixel electrode including a first vertical stem portion and a first horizontal stem portion that is disposed perpendicular to the first vertical stem portion at an end of the first vertical stem portion, and a second subpixel electrode including a second vertical stem portion and a second horizontal stem portion that is disposed perpendicular to the second vertical stem portion at an end of the second vertical step portion.

The display device is a curved display device having curved edges along a short-side direction of the display device.

The pixel electrode may further include first minute branch portions extending from the first vertical stem portion and the first horizontal stem portion, and second minute branch portions extending from the second vertical stem portion and the second horizontal stem portion.

The first subpixel electrode may include a plurality of subpixel columns each having a first horizontal stem portion and a first vertical stem portion. First horizontal stem portions in adjacent subpixel columns may be connected to opposite ends of first vertical stem portions, respectively.

The second pixel electrode may include the plurality of subpixel columns each having a second horizontal stem portion and a second vertical stem portion. Second horizontal stem portions in adjacent subpixel columns may be connected to opposite ends of second vertical stem portions, respectively The first and second horizontal stem portions disposed in the same subpixel column may be coupled to the same ends of the first vertical stem portion and the second vertical stem portion.

The thin film transistor may include: a gate line disposed on the first insulation substrate; a semiconductor layer disposed on the gate line; and a data line disposed on the semiconductor layer and including a source electrode and a drain electrode. The first and second subpixel electrodes may be disposed to be separated from each other with respect to the gate line, and a configuration of the first and second horizontal stem portions may be symmetrically disposed with respect to the gate line.

Two pixel electrodes adjacent in a row direction may be symmetrical to each other.

A configuration of two pixel electrodes adjacent in a column direction may be symmetrical to each other.

The second horizontal stem portion disposed in an n-th row of the same column and the first horizontal stem portion disposed in an (n+1)-th row of the same column may be coupled to the same ends of the second vertical stem portion and the first vertical stem portion.

The number of the second horizontal stem portions may be greater than that of the first horizontal stem portions.

The first subpixel electrode may include one first horizontal stem portion, and the first horizontal stem portion of the pixel electrode adjacent in a row direction is connected to a different end of the first vertical stem portion.

The second subpixel electrode may include one second horizontal stem portion, and the second horizontal stem portion of the pixel electrode adjacent in the row direction is connected to a different end of the second vertical stem portion.

The first vertical stem portion, the second vertical stem portion, and the short sides may be parallel to each other.

The pixel electrode may further include first minute branch portions extending from the first vertical stem portion and the first horizontal stem portion, and second minute branch portions extending from the second vertical stem portion and the second horizontal stem portion.

The first subpixel electrode may include a plurality of subpixel columns each having a first horizontal stem portion and a first vertical stem portion. First horizontal stem portions in adjacent subpixel columns may be connected to opposite ends of first vertical stem portions, respectively.

The second pixel electrode may include the plurality of subpixel columns each having a second horizontal stem portion and the second vertical stem portion. Second horizontal stem portions in adjacent subpixel columns are connected to opposite ends of second vertical stem portions, respectively.

Two pixel electrodes adjacent in a row direction may be symmetrical to each other.

A configuration of two pixel electrodes adjacent in a column direction may be symmetrical to each other.

The second horizontal stem portion disposed in an n-th row of the same column and the first horizontal stem portion disposed in an (n+1)-th row of the same column may be coupled to the same ends of the second vertical stem portion and the first vertical stem portion.

According to the display device described above, even if the display device is curved in the short-side direction, the texture can be suppressed and the improved luminance can be provided.

DETAILED DESCRIPTION OF THE EMBODIMENTS

Figure 1A:
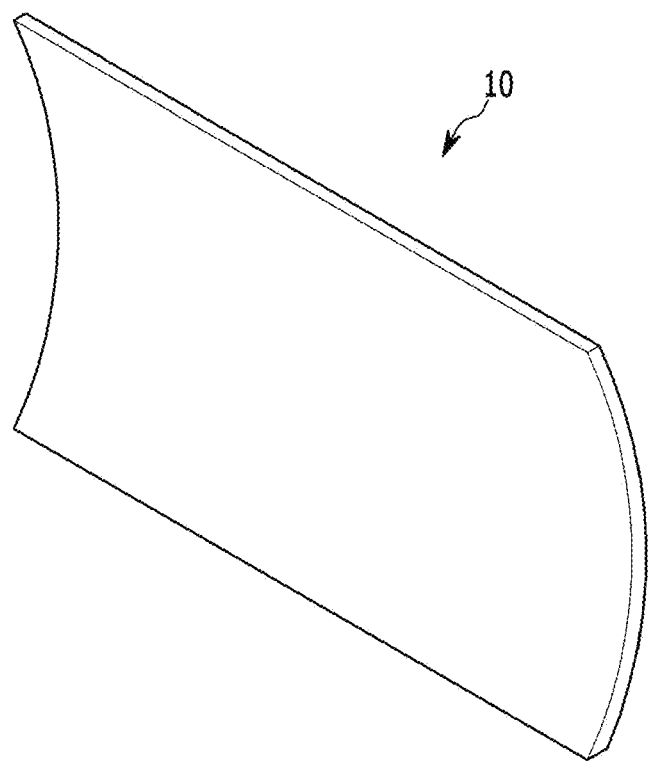
FIG. 1A is a perspective view of a display device according to an exemplary embodiment of the present inventive concept.

The present inventive concept will be described more fully hereinafter with reference to the accompanying drawings, in which exemplary embodiments of the inventive concept are shown.

As those skilled in the art would realize, the described embodiments may be modified in various different ways, all without departing from the spirit or scope of the present inventive concept.

In the drawings, the thickness of layers, films, panels, regions, etc. are exaggerated for clarity.

Like reference numerals designate like elements throughout the specification.

It will be understood that when an element such as a layer, film, region, or substrate is referred to as being "on" another element, it can be directly on the other element or intervening elements may also be present between the element and the other element.

In contrast, when an element is referred to as being "directly on" another element, there are no intervening elements present between the element and the other element.

In the following, a display device having curved edges along a short-side direction will be described with reference to FIG. 1, and a curved display device according to an exemplary embodiment of the present inventive concept will be described with reference to FIGS. 2 to 6.

Figure 1B:
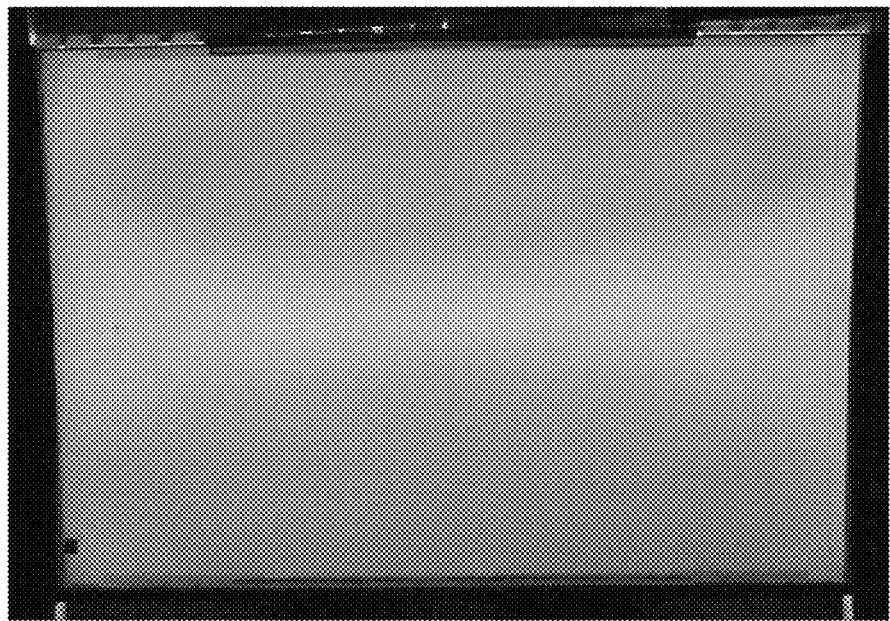
FIG. 1B is an image of dark areas generated when it is curvedly formed in a short-side direction.
Figure 2:
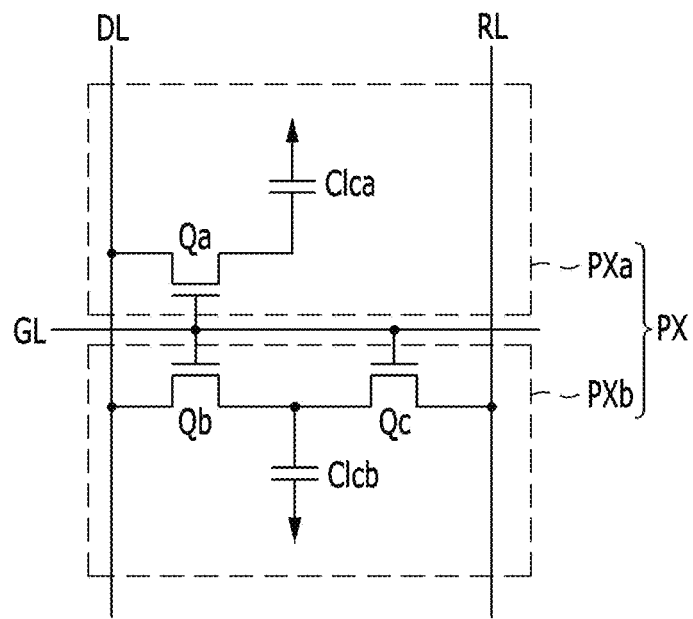
FIG. 2 is a circuit diagram of one pixel according to the exemplary embodiment of the present inventive concept.
Figure 3:
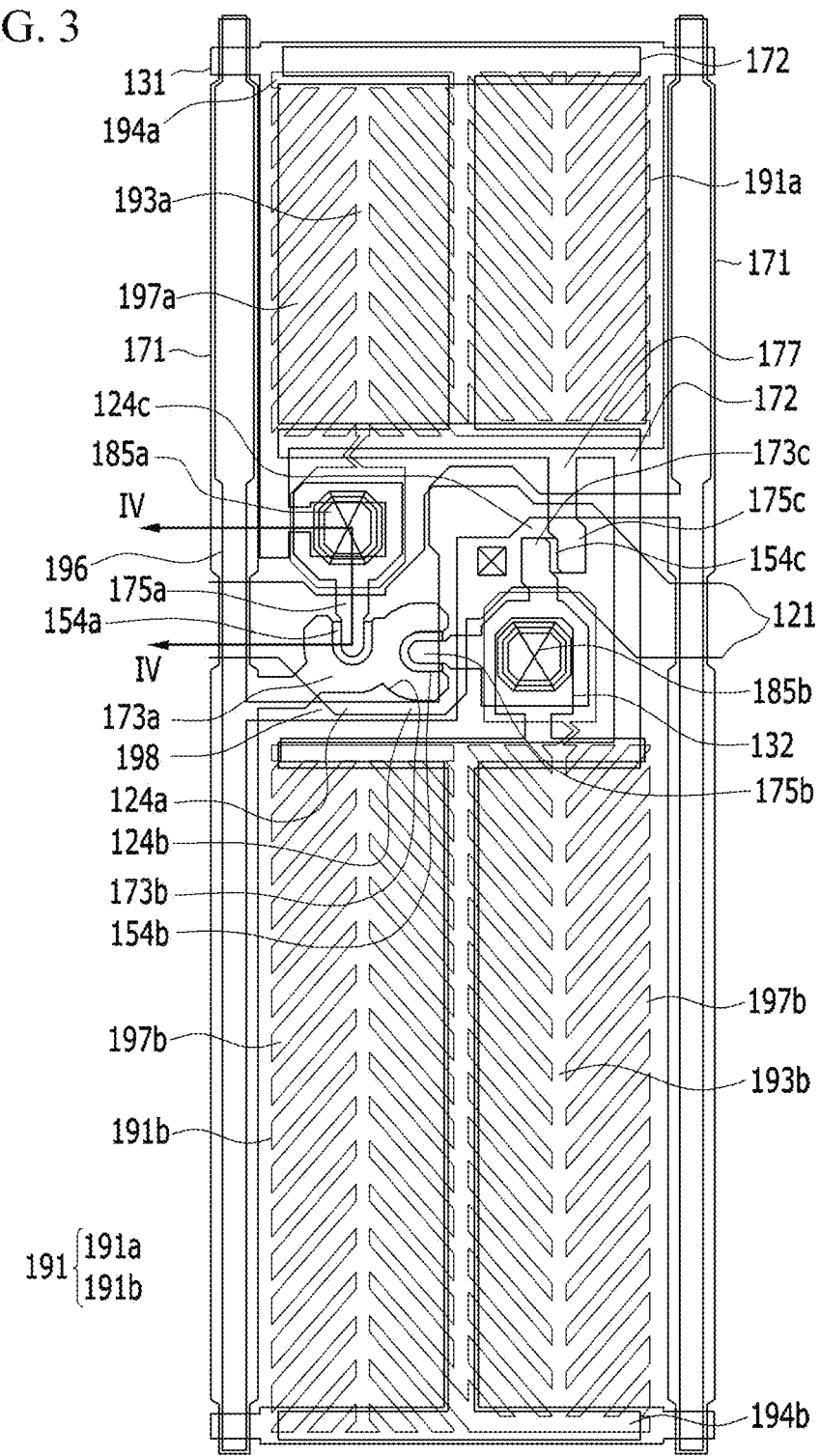
FIG. 3 is a planar layout view of one pixel according to the exemplary embodiment of the present inventive concept.
Figure 4:
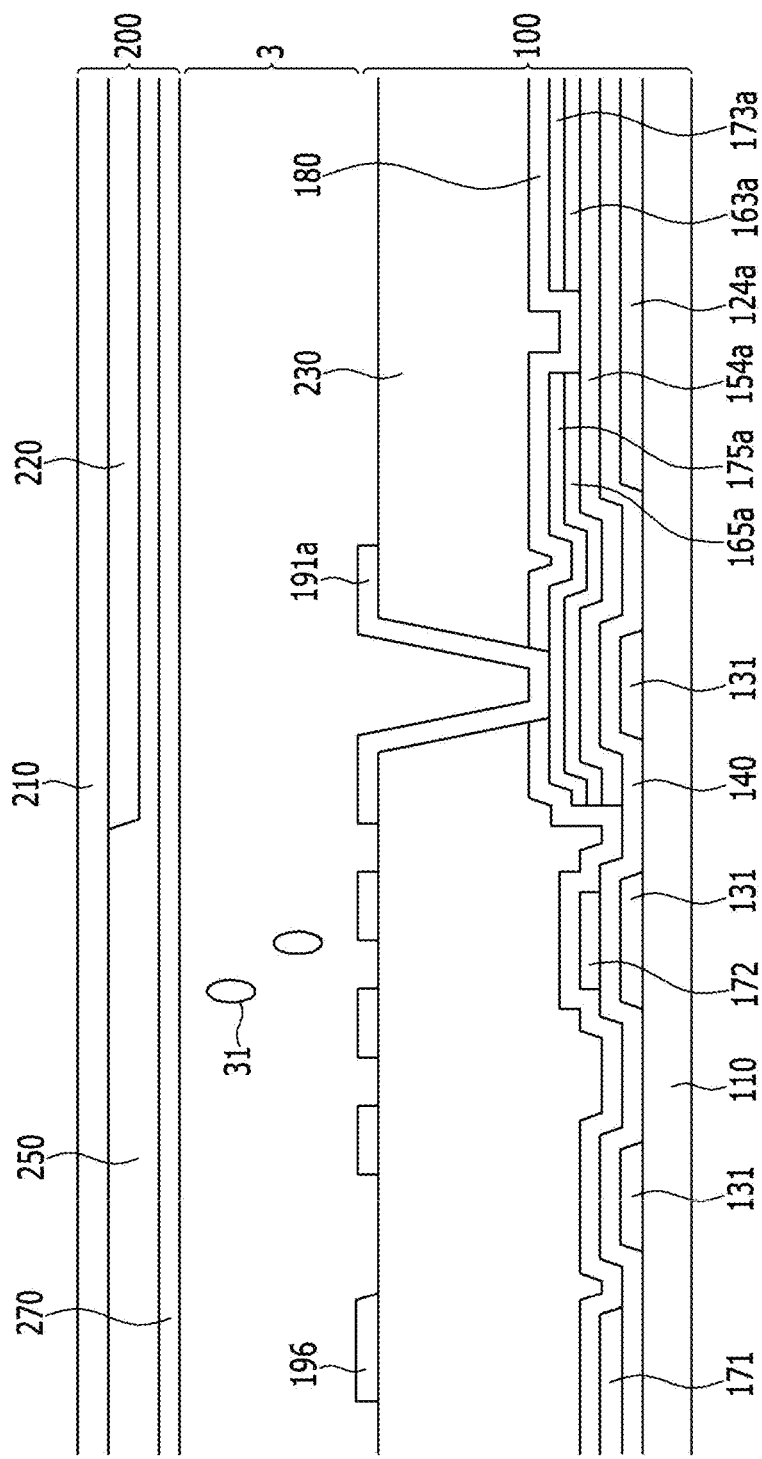
FIG. 4 is a cross-sectional view of FIG. 3 taken along the line IV-IV.
Figure 5:
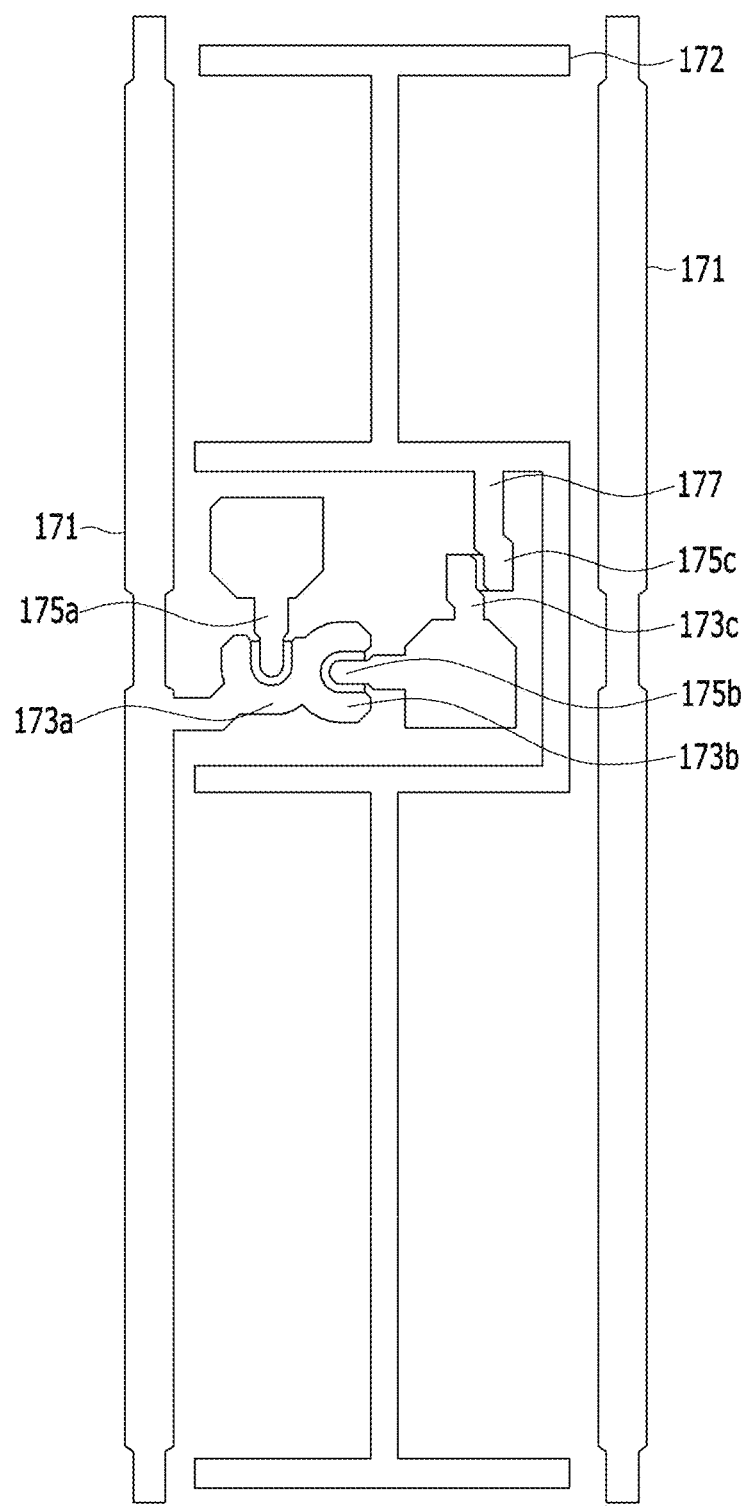
FIG. 5 is a top plan view of a data conductor layer of FIG. 3.
Figure 6:
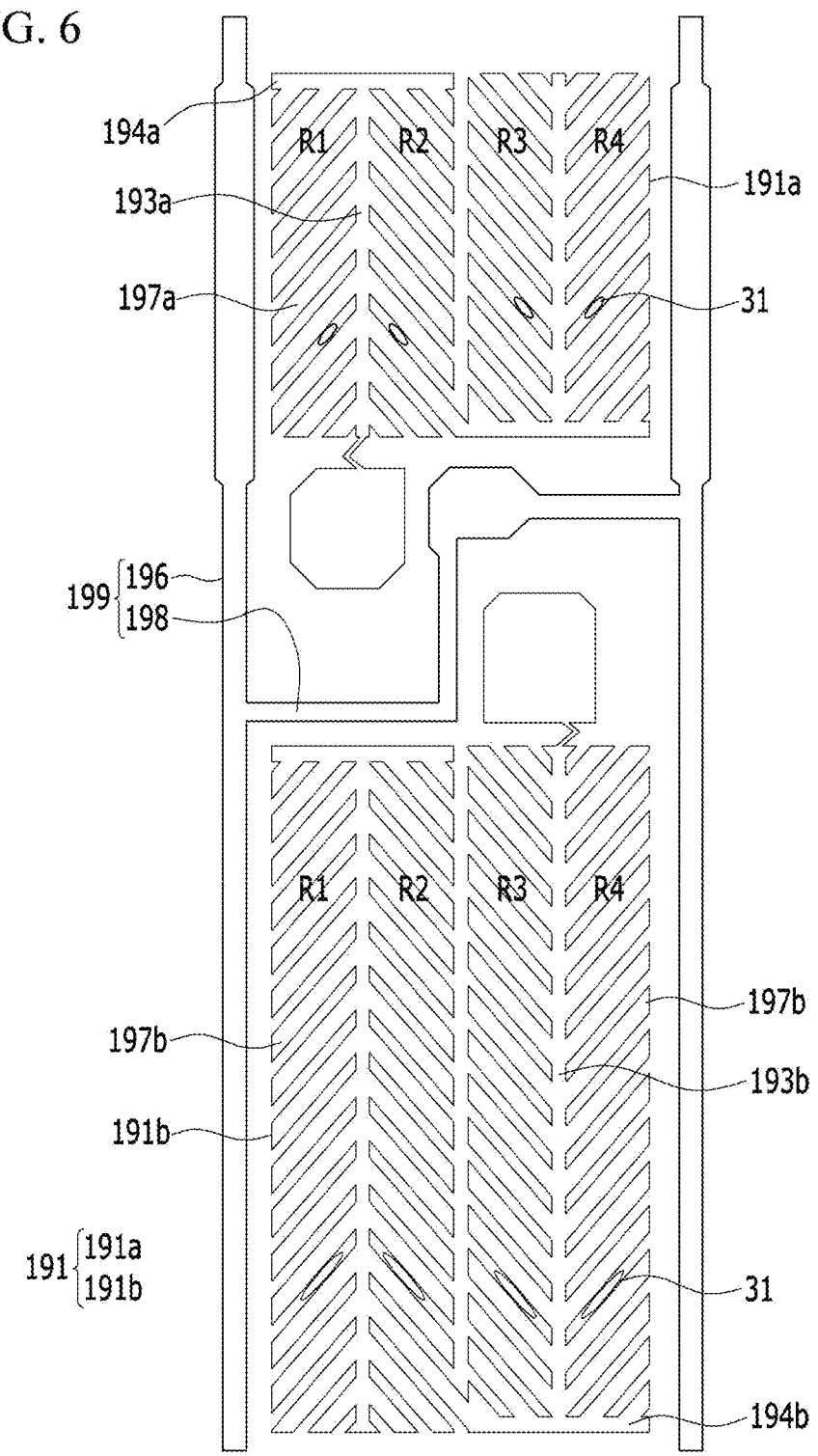
FIG. 6 is a top plan view of a pixel electrode layer of FIG. 3.

FIG. 1A is a perspective view of a display device according to an exemplary embodiment of the present inventive concept, FIG. 1B is an image of dark areas generated when it is bent to have curved edges along a short-side direction, FIG. 2 is a circuit diagram of one pixel according to the exemplary embodiment of the present inventive concept, FIG. 3 is a planar layout view of one pixel according to the exemplary embodiment of the present inventive concept, FIG. 4 is a cross-sectional view of FIG. 3 taken along the line IV-IV, FIG. 5 is a top plan view of a data conductor layer of FIG. 3, and FIG. 6 is a top plan view of a pixel electrode layer of FIG. 3.

Referring first to FIG. 1A, the display device 10 according to the exemplary embodiment of the present inventive concept is a curved display device, and particularly, may be a display device curvedly formed in a vertical direction.

As shown in FIG. 1A, the display device 10 may have a rectangular shape including long sides and short sides, and the display device 10 according to the exemplary embodiment of the present inventive concept is formed such that its short sides are curved in the vertical direction.

As shown in FIG. 1B, since the display device curved in a short-side direction may have dark areas and luminance deterioration due to misalignment between upper and lower substrates that occurs in the vertical direction, the exemplary embodiment of the present inventive concept has been made in an effort to solve this problems.

However, the present inventive concept is not limited to only a curved display device, and may also be applicable to a flat panel display device.

Referring to FIG. 2, one pixel PX of the display device according to the present exemplary embodiment includes: a plurality of signal lines including a gate line GL for transmitting a gate signal, a data line DL for transmitting a data signal, and a divided reference voltage line RL for transmitting a divided reference voltage; and first, second, and third switching elements Qa, Qb, and Qc and first and second liquid crystal capacitors Clca and Clcb that are coupled to the plurality of signal lines.

The first and second switching elements Qa and Qb are respectively coupled to the gate line GL and the data line DL, and the third switching element Qc is coupled to an output terminal of the second switching element Qb and the divided reference voltage line RL.

The first and second switching elements Qa and Qb are three-terminal elements such as a thin film transistor and the like, control terminals thereof are coupled to the gate line GL, input terminals thereof are coupled to the data line DL, an output terminal of the first switching element Qa is coupled to the first liquid crystal capacitor Clca, and the output terminal of the second switching element Qb is coupled to the second liquid crystal capacitor Clcb and an input terminal of the third switching element.

The third switching element Qc is also a three-terminal element such as a thin film transistor and the like, a control terminal thereof is coupled to the gate line GL, an input terminal thereof is coupled to the second liquid crystal capacitor Clcb, and an output terminal thereof is coupled to the divided reference voltage line RL.

When a gate-on signal is applied to the gate line GL, the first, second, and third switching elements Qa, Qb and Qc connected thereto are turned on.

Accordingly, a data voltage applied to the data line DL is applied to a first subpixel electrode PXa and a second subpixel electrode PXb through the turned-on first and second switching elements Qa and Qb.

In this case, the data voltages applied to the first and second subpixel electrodes PXa and PXb are identical to each other, and the first and second liquid crystal capacitors Clca and Clcb are charged with the same amount of charges corresponding to a difference between a common voltage and the data voltage.

Simultaneously, a voltage charged to the second liquid crystal capacitor Clcb is divided by the turned-on third switching element Qc.

Thus, the voltage charged to the second liquid crystal capacitor Clcb is decreased by a difference between the common voltage and the divided reference voltage.

That is, a voltage charged to the first liquid crystal capacitor Clca is higher than the voltage charged to the second liquid crystal capacitor Clcb.

As such, the voltages charged to the first and second liquid crystal capacitors Clca and Clcb become different from each other.

Since the voltages of the first and second liquid crystal capacitors Clca and Clcb are different from each other, tilt angles of liquid crystal molecules of the first and second subpixel electrodes are different, thereby obtaining the two subpixel electrodes of different luminances.

Accordingly, when the voltages of the first and second liquid crystal capacitors Clca and Clcb are appropriately adjusted, an image viewed from a front side is as close as possible to an image viewed from a lateral side, thereby improving side visibility.

In the illustrated exemplary embodiment, the third switching element Qc coupled to the second liquid crystal capacitor Clcb and the divided reference voltage line RL is included to make the voltages charged to the first and second liquid crystal capacitors Clca and Clcb different, but the second liquid crystal capacitor Clcb may be coupled to a step-down capacitor in the case of an LCD according to another exemplary embodiment of the present inventive concept.

Specifically, the third switching element including a first terminal coupled to a step-down gate line, a second terminal coupled to the second liquid crystal capacitor Clcb, and a third terminal coupled to the step-down capacitor may be included such that an amount of charges charged in the second liquid crystal capacitor Clcb may be partially charged in the step-down capacitor, thereby the charged voltages between the first and second liquid crystal capacitors Clca and Clcb may have different voltages.

In addition, in the case of the LCD according to another exemplary embodiment of the present inventive concept, the first and second liquid crystal capacitors Clca and Clcb are respectively coupled to different data lines such that they are applied with different data voltages, thereby the charged voltages between the first and second liquid crystal capacitors Clca and Clcb may have different voltages.

Alternatively, using various different methods, the charged voltages between the first and second liquid crystal capacitors Clca and Clcb may be differently set.

These will be described in more detail with reference to FIGS. 15 to 18.

Next, referring to FIGS. 3 and 4, gate conductors including a gate line 121 and storage electrode lines 131 and 132 are disposed on a first insulation substrate 110 that is formed of transparent glass, plastic, or the like.

The gate line 121 includes gate electrodes 124a, 124b, and 124c, and a wide end portion (not shown) for connection with another layer or an external driving circuit.

The gate line 121 and the storage electrode lines 131 and 132 may be formed of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta), titanium (Ti), etc.

The gate line 121 and the storage electrode lines 131 and 132 may have a multilayer structure in which at least two conductive layers having different physical properties are included.

The gate line 121 crosses a pixel area in a row direction.

A first subpixel electrode 191a for displaying a high gray may be disposed above the gate line 121, a second subpixel electrode 191b for displaying a low gray may be disposed below the gate line 121, and their positions can be interchanged.

The storage electrode lines 131 and 132 are formed of the same material as the gate line 121, and may be formed at the same time with the gate line 121.

The first storage electrode line 131 disposed above the gate line 121 may have a quadrangular shape that encloses the first subpixel electrode 191a.

An uppermost side of the quadrangular shaped first storage electrode line 131 may extend out of one pixel area such that it horizontally extends to be coupled to another layer or an external driving circuit.

The second storage electrode line 132 disposed below the gate line 121 includes a plurality of horizontal portions, and a plurality of vertical portions that interconnect the plurality of horizontal portions at the end of the plurality of horizontal portions.

In the present specification, as described above, shapes of the storage electrode lines 131 and 132 are described and illustrated, but they are not limited thereto and may have any shapes for performing the same function.

Next, a gate insulating layer 140 is disposed on the gate conductors 121, 131, and 132.

A first semiconductor layer 154a, a second semiconductor layer 154b, and a third semiconductor layer 154c are disposed on the gate insulating layer 140.

A plurality of ohmic contacts which include 163a and 165a are disposed on the semiconductor layers 154a, 154b, and 154c, and may be omitted if the semiconductor layers 154a, 154b, and 154c are formed of an oxide semiconductor material.

A data line 171 including source electrodes 173a, 173b, and 173c and a data conductor including drain electrodes 175a, 175b, and 175c and a divided reference voltage line 172 are formed on the ohmic contacts 163a and 165a and the gate insulating layer 140.

The data conductor, the ohmic contacts, and the semiconductor layers disposed therebelow may be simultaneously formed using one mask.

FIG. 5 is a top plan view of the data conductor layer according to the exemplary embodiment of the present inventive concept.

The data conductor includes the data line 171, a first source electrode 173a, a second source electrode 173b, a third source electrode 173c, a first drain electrode 175a, a second drain electrode 175b, a third drain electrode 175c, and the divided reference voltage line 172.

The data line 171 extends in a column direction along an edge of one pixel area, and includes the first and second source electrodes 173a and 173b.

The first and second source electrodes 173a and 173b may have a U-shape, but they are not limited thereto.

The first drain electrode 175a faces the first source electrode 173a and has, as an example, an I-shape surrounded by the U-shaped first source electrode 173a, and includes a widely expanded region that is coupled to the first subpixel electrode 191a.

Similarly, the second drain electrode 175b faces the second source electrode 173b and has, as an example, an I-shape surrounded by the U-shaped second source electrode 173b, and includes a widely expanded region that is connected to the second subpixel electrode 191b.

The third source electrode 173c is formed to extend from one end of the second drain electrode 175b.

In addition, the data conductor includes the divided reference voltage line 172, and the divided reference voltage line 172 includes the third drain electrode 175c that form the thin film transistor with the third source electrode 173c and the third semiconductor layer 154c.

Referring to FIG. 5, the divided reference voltage line 172 includes a plurality of horizontal portions and a plurality of vertical portions for interconnecting the plurality of horizontal portions.

In the divided reference voltage line 172, the plurality of horizontal portions and the plurality of vertical portions for interconnecting them may be included such that the vertical portions are connected at one end of each of the horizontal portions that are parallel to each other.

That is, the divided reference voltage line 172 disposed in the first and second subpixel electrodes may have an "I" shape, respectively.

The divided reference voltage line 172 may respectively have different shapes depending on shapes of the first and second subpixel electrodes 191a and 191b.

The divided reference voltage line 172 disposed in the first and second subpixel electrodes 191a and 191b may respectively include two horizontal portions and one vertical portion that are respectively formed to overlap a first vertical stem portion 193a, a second vertical stem portion 193b, first minute branch portions 197a, and second minute branch portions 197b.

These are arranged according to a shape of the pixel electrode 191, and a shape of the divided reference voltage line 172 may also be modified as the shape of pixel electrode 191 is modified.

Specifically, the divided reference voltage line 172 disposed in the first subpixel electrode 191a partially overlaps ends of the first vertical stem portion 193a and the first minute branch portions 197a.

In addition, the divided reference voltage line 172 disposed in the second subpixel electrode 191b may partially overlap ends of the second vertical stem portion 193b and the second minute branch portions 197b.

In the divided reference voltage line 172 disposed in the first subpixel electrode 191a, a lowermost part of the horizontal portion 177 may be partially branched downward to face the third source electrode 173c to be the third drain electrode 175c.

The first gate electrode 124a, the first source electrode 173a, and the first drain electrode 175a that are described above form a first thin film transistor (TFT) Qa along with the first semiconductor layer 154a, and a channel of the TFT is formed in the first semiconductor layer 154a between the first source electrode 173a and the first drain electrode 175a.

Similarly, the second gate electrode 124b, the second source electrode 173b, and the second drain electrode 175b form a second TFT Qb along with the second semiconductor layer 154b, and a channel of the TFT is formed in the second semiconductor layer 154b between the second source electrode 173b and the second drain electrode 175b, while the third gate electrode 124c, the third source electrode 173c, and the third drain electrode 175c form a third TFT Qc along with the third semiconductor layer 154c, and a channel of the TFT is formed in the third semiconductor layer 154c between the third source electrode 173c and the third drain electrode 175c.

A passivation layer 180 is disposed on the data conductor and the exposed the semiconductor layers 154a, 154b, and 154c.

The passivation layer 180 may be formed of a material such as a silicon nitride, a silicon oxide, or the like used to form an inorganic insulating layer.

When the passivation layer 180 is disposed below a color filter 230, it prevents a pigment of the color filter 230 from being introduced into the exposed semiconductor layers 154a, 154b, and 154c.

The color filter 230 may be disposed on the passivation layer 180.

The color filter 230 may uniquely display one of primary colors, and the primary colors may be, for example, primary colors such as red, green, and blue, or yellow, cyan, magenta, and the like.

Though not illustrated, the color filter 230 may further include a color filter 230 for displaying mixed colors of the primary colors or white.

A first contact hole 185a and a second contact hole 185b are disposed in the passivation layer 180 and the color filter 230 to expose the first and second drain electrodes 175a and 175b.

A pixel electrode 191 is disposed on the color filter 230.

The pixel electrode 191 includes the first and second subpixel electrodes 191a and 191b that are separated from each other while interposing the gate line 121 therebetween and neighboring each other in the column direction.

The pixel electrode 191 may be formed of a transparent conductive material such as ITO or IZO, or a reflective metal such as aluminum, silver, chromium, or an alloy thereof.

A shielding electrode 199 formed of the same material as the pixel electrode 191 is disposed in the same layer as the pixel electrode 191 on the color filter 230.

The pixel electrode 191 and the shielding electrode 199 may be simultaneously formed in the same process.

The pixel electrode 191 and the shielding electrode 199 according to the present inventive concept will now be described with reference to FIG. 6.

The shielding electrode 199 will be described first.

The shielding electrode 199 include vertical portions 196 overlapping the data lines that are disposed at the edge of one pixel area, and at least one horizontal portion 198 for interconnecting the neighboring vertical portions 196.

An expansion may be provided in the middle of the horizontal portion 198 of the shielding electrode 199.

The same voltage as that of the common electrode 270 is applied to the shielding electrode 199.

No electric field is generated between the shielding electrode 199 and the common electrode and thus the liquid crystal layer interposed therebetween is not altered and maintained as an initial configuration which does not pass through light.

Accordingly, the area between the shielding electrode and the common electrode blocks light, thus maintains a black state.

When the liquid crystals exhibit black as described above, the liquid crystal molecules themselves may perform a function of the light blocking member.

Accordingly, the light blocking member usually disposed in the upper panel may be omitted in the LCD that includes the lower panel according to the exemplary embodiment of the present inventive concept.

That is, the liquid crystal molecules between the shielding electrode and the common electrode perform the function of the light blocking member.

The pixel electrode 191 will now be described.

The pixel electrode 191 includes the first subpixel electrode 191a and the second subpixel electrode 191b that are separated while interposing the gate line 121 therebetween and neighbor each other in the column direction with respect to the gate line 121.

The first subpixel electrode 191a includes the first vertical stem portion 193a that extends in the column direction (extending direction of the data line), a first horizontal stem portion 194a that is coupled to an end of the first vertical stem portion 193a to be perpendicular thereto, and the plurality of first minute branch portions 197a that diagonally extend from the first vertical stem portion 193a and the first horizontal stem portion 194a.

The first minute branch portions 197a extending from the first vertical stem portion 193a and the first horizontal stem portion 194a obliquely extend in a direction away from the first horizontal stem portion 194a.

As an example, the first subpixel electrode 191a includes two first vertical stem portions 193a and two first horizontal stem portions 194a, and the first minute branch portions 197a extending from the different first vertical stem portions 193a and the different first horizontal stem portions 194a may respectively have different extending directions. The extending direction of the first minute branch portions 197a may be opposite to each other.

Referring to FIG. 6, either one of the first vertical stem portions 193a is coupled to the first horizontal stem portion 194a at its upper end, while the other one of the first vertical stem portions 193a is coupled to the first horizontal stem portion 194a at its lower end.

The first minute branch portions 197a extending from a left side (R1) of the first vertical stem portion 193a, an upper end of which is coupled to the first horizontal stem portion 194a, extend in a lower left direction, while the first minute branch portions 197a extending from a right side (R2) of the first vertical stem portion 193a extend in a lower right direction.

In addition, the first minute branch portions 197a extending from a left side (R3) of the first vertical stem portion 193a, a lower end of which is coupled to the first horizontal stem portion 194a, extend in an upper left direction, while the first minute branch portions 197a extending from a right side (R4) of the first vertical stem portion 193a extend in an upper right direction. The regions, R1, R2, R3 and R4, may be arranged along a row direction.

However, these directions are exemplarily illustrated and thus numerous variations and combinations thereof may also be possible.

The first subpixel electrode 191a falls into the plurality of regions R1, R2, R3, and R4 according to extending directions of the first vertical stem portion 193a, the first horizontal stem portion 194a, and the first minute branch portions 197a.

That is, the first horizontal stem portion 194a, the first vertical stem portion 193a, and a gap between adjacent the first minute branch portions 197a form a border between the neighboring regions R1, R2, R3, and R4.

The plurality of first minute branch portions 197a disposed in the regions R1, R2, R3, and R4 may respectively extend in the different directions.

Particularly, the minute branch portions 197a of the adjacent regions R1, R2, R3, and R4 may form an angle of about 90° or 180°.

The extending directions of the first minute branch portions 197a in each of the regions R1, R2, R3, and R4 may be predetermined.

In this case, sides of the first minute branch portions 197a distort the electric field to create a horizontal component for determining tilt directions of the liquid crystal molecules 31.

The horizontal component of the electric field is nearly parallel to the sides of the first minute branch portions 197a.

As shown in FIG. 6, the liquid crystal molecules 31 are tilted in a direction parallel to a length direction of the first minute branch portions 197a.

Thus, the liquid crystal molecules 31 disposed in the first region R1 are arranged in the upper right direction, the liquid crystal molecules 31 disposed in the second region R2 are arranged in the upper left direction, the liquid crystal molecules 31 disposed in the third region R3 are arranged in the lower right direction, and the liquid crystal molecules 31 disposed in the fourth region R4 are arranged in the lower left direction.

Since the first subpixel electrode 191a includes the four regions R1 to R4 in which the extending directions of the first minute branch portions 197a are respectively different, the tilt directions of the liquid crystal molecules 31 are substantially tilted in four directions, and the four domains having different alignment directions of the liquid crystal molecules are formed in the liquid crystal layer 3.

As such, when the liquid crystal molecules are tilted in various directions, a reference viewing angle of the LCD becomes wider.

Minute slits where a part of the electrode is removed are formed between the adjacent first minute branch portions 197a.

An acute angle formed between the first minute branch portion 197a and the first vertical stem portion 193a may be about 40° to 45°, but it is not limited thereto, and may be appropriately adjusted in consideration of display characteristics such as visibility and the like of the LCD.

Some of the first minute branch portions 197a extending from the neighboring first vertical stem portion 193a may be coupled to each other.

In addition, some other first minute branch portions 197a are coupled to an expansion of the first subpixel electrode such that they are supplied with the voltage from the first contact hole 185a through the first drain electrode 175a.

A shape of the second subpixel electrode 191b according to the exemplary embodiment of the present inventive concept is similar to that of the first subpixel electrode 191a.

The second subpixel electrode 191b includes the second vertical stem portion 193b that extends in the column direction (extending direction of the data line), a second horizontal stem portion 194b that is perpendicular to the second vertical stem portion 193b and connected at an end of the second vertical stem portion 193b, and the plurality of second minute branch portions 197b that diagonally extend from the second vertical stem portion 193b and the second horizontal stem portion 194b.

The second minute branch portions 197b extending from the second vertical stem portion 193b and the second horizontal stem portion 194b obliquely extend in a direction away from the second horizontal stem portion 194b.

As an example, the second subpixel electrode 191b includes two second vertical stem portions 193b and two second horizontal stem portions 194b, and the second minute branch portions 197b extending from the different second vertical stem portions 193a and the different first horizontal stem portions 194a may respectively have different extending directions.

Referring to FIG. 6, either one of the second vertical stem portions 193b is coupled to the second horizontal stem portion 194b at its upper end, while the other one of the second vertical stem portions 193b is coupled to the second horizontal stem portion 194b at its lower end.

The second minute branch portions 197b extending from a left side (R1) of the second vertical stem portion 193b, an upper end of which is coupled to the second horizontal stem portion 194b, extend in the lower left direction, while the second minute branch portions 197b extending from a right side (R2) of the second vertical stem portion 193b extend in the lower right direction.

In addition, the second minute branch portions 197b extending from a left side (R3) of the second vertical stem portion 193b, a lower end of which is coupled to the second horizontal stem portion 194b, extend in the upper left direction, while the second minute branch portions 197b extending from a right side (R4) of the second vertical stem portion 193b extend in the upper right direction.

However, these directions are exemplarily illustrated and thus numerous variations and combinations thereof may be also possible.

The second subpixel electrode 191b includes the plurality of regions R1, R2, R3, and R4 according to extending directions of the second vertical stem portion 193b, the second horizontal stem portion 194b, and the second minute branch portions 197b.

That is, the second horizontal stem portion 194b, the second vertical stem portion 193b, and a gap between adjacent the second minute branch portions 197b form a border between the neighboring regions R1, R2, R3, and R4.

The plurality of second minute branch portions 197b disposed in the regions R1, R2, R3, and R4 may respectively extend in the different directions.

Particularly, the minute branch portions 197b of the adjacent regions R1, R2, R3, and R4 may form an angle of about 90° or 180°.

The extending directions of the second minute branch portions 197b in each of the regions R1, R2, R3, and R4 may be predetermined.

In this case, sides of the second minute branch portions 197b distort the electric field to create a horizontal component for determining tilt directions of the liquid crystal molecules 31.

The horizontal component of the electric field is nearly parallel to the sides of the second minute branch portions 197b.

As shown in FIG. 6, the liquid crystal molecules 31 are tilted in a direction parallel to a length direction of the second minute branch portions 197b.

Thus, the liquid crystal molecules 31 disposed in the first region R1 are arranged in the upper right direction, the liquid crystal molecules 31 disposed in the second region R2 are arranged in the upper left direction, the liquid crystal molecules 31 disposed in the third region R3 are arranged in the lower right direction, and the liquid crystal molecules 31 disposed in the fourth region R4 are arranged in the lower left direction.

Since the second subpixel electrode 191b includes the four regions R1 to R4 having different extending directions of the second minute branch portions 197b, the tilt directions of the liquid crystal molecules 31 are substantially tilted in four directions, and the four domains in which the alignment directions of the liquid crystal molecules 31 are different are formed in the liquid crystal layer 3.

As such, when the liquid crystal molecules are tilted in various directions, a reference viewing angle of the LCD becomes wider.

Minute slits where a part of the electrode is removed are formed between the adjacent second minute branch portions 197b.

An acute angle formed between the second minute branch portion 197b and the second vertical stem portion 193b may be about 40° to 45°, but it is not limited thereto, and may be appropriately adjusted in consideration of the display characteristics such as the visibility and the like of the LCD.

Some of the second minute branch portions 197b extending from the neighboring second vertical stem portion 193b may be coupled to each other.

In addition, some other second minute branch portions 197b are coupled to an expansion of the second subpixel electrode such that they are supplied with the voltage from the second contact hole 185b through the second drain electrode 175b.

The upper panel 200 will now be described.

A light blocking member 220 is disposed on a second insulation substrate 210 that is formed of transparent glass or plastic, and faces the first insulation substrate 110.

The light blocking member 220 is referred to as a black matrix and prevents leakage of light.

The light blocking member 220 according to the exemplary embodiment of the present inventive concept may extend in the row direction along the gate line 121.

As shown in the exemplary embodiment of the present inventive concept, when the color filter 230 is disposed on the lower panel 100, the color filter of the upper panel 200 may be omitted, but it is not limited thereto, and the color filter may be disposed on the second insulation substrate 210.

On the contrary, according to the exemplary embodiment of the present inventive concept, the light blocking member 220 disposed on the second insulation substrate 210 may also be disposed on the first insulation substrate 110.

An overcoat 250 is disposed on the light blocking member 220.

The overcoat 250 may be formed of an organic material or an inorganic material, prevents the light blocking member 220 from being exposed, and planarizes a surface of the upper panel 200.

The overcoat 250 may be omitted.

The common electrode 270 is disposed on the overcoat 250.

The common electrode 270 may be formed of the same material as the pixel electrode 191, and has a planar shape to be applied with the common voltage.

In addition, an alignment layer (not shown) may be disposed on the pixel electrode 191 and the common electrode 270.

The liquid crystal layer 3 is disposed between the lower panel 100 and the upper panel 200.

The liquid crystal layer 3 has negative dielectric anisotropy, and the liquid crystal molecules 31 of the liquid crystal layer 3 are aligned such that their long axes are perpendicular to surfaces of the two display panels 100 and 200 when no electric field is applied.

The first and second subpixel electrodes 191a and 191b to which the data voltage is applied generate the electric field along with the common electrode 270 of the upper panel 200, thereby determining the alignment directions of the liquid crystal molecules of the liquid crystal layer 3 that is disposed between the two electrodes 191 and 270.

Depending on the determined directions of the liquid crystal molecules, luminance of light passing through the liquid crystal layer 3 is controlled.

As described above, according to the exemplary embodiment of the present inventive concept, in the curved display device that is curved in the vertical direction along which the short-sides are disposed, the short-sides, the first vertical stem portion, and the second vertical stem portion are disposed parallel to each other.

Accordingly, even if the upper and lower substrates are misaligned in the vertical direction, the liquid crystal molecules are not affected by the misalignment, thereby reducing luminance deterioration caused by generation of texture, and dark areas.

Figure 7:
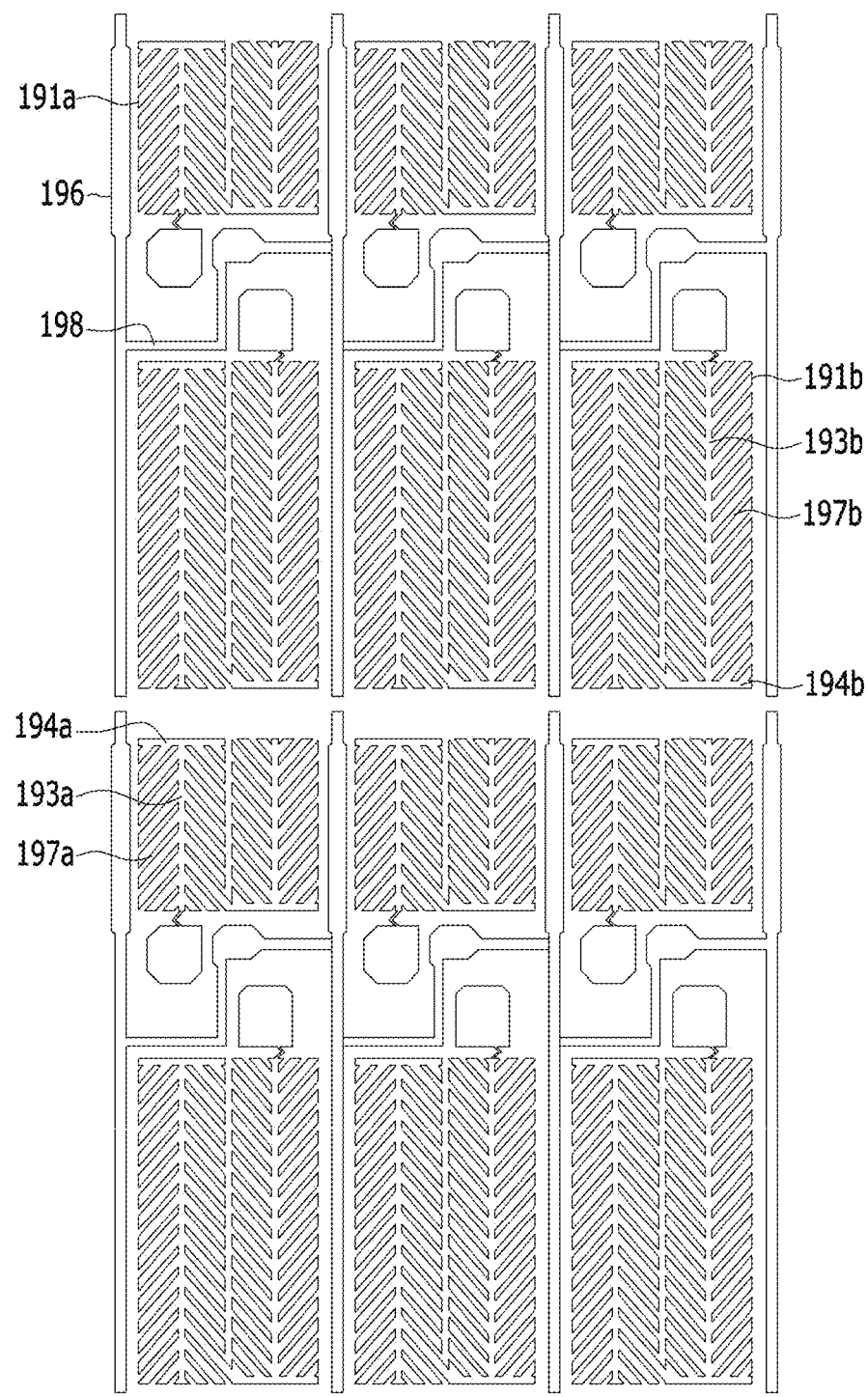
FIG. 7 is a layout view of a plurality of pixels according to the exemplary embodiment of the present inventive concept.

FIG. 7 is a layout view of a plurality of pixels according to the exemplary embodiment of the present inventive concept.

As shown in FIG. 7, in the plurality of pixel areas according to the exemplary embodiment of the present inventive concept, the same pixel electrodes, each of which includes the first subpixel electrode 191a and the second subpixel electrode 191b, may be arranged in a matrix form.

Specifically, each of the first subpixel electrodes 191a includes two first vertical stem portions 193a and two first horizontal stem portions 194a, and the two first horizontal stem portions 194a may be respectively disposed at different ends of the first vertical stem portions 193a.

That is, either one of the first horizontal stem portions 194a may be coupled to the upper end of the first vertical stem portion 193a, while the other one of the first horizontal stem portions 194a may be coupled to the lower end of the first vertical stem portion 193a.

The plurality of first horizontal stem portions 194a may be alternately disposed with respect to each other.

The second subpixel electrode 191b may also have a shape that is similar to that of the first subpixel electrode 191a.

Each of the second subpixel electrodes 191b includes two second vertical stem portions 193b and two second horizontal stem portions 194b, and the two second horizontal stem portion 194b may be respectively disposed at different ends of the second vertical stem portions 193b.

That is, either one of the second horizontal stem portions 194b may be coupled to the upper end of the second vertical stem portion 193b, while the other one of the second horizontal stem portions 194b may be coupled to the lower end of the second vertical stem portion 193b.

The plurality of second horizontal stem portions 194b may be alternately disposed with respect to each other.

In addition, as illustrated in FIG. 7, one pixel column has two subpixel columns, a left-side subpixel column and a right-side subpixel column and the horizontal stem portions 194a and 194b disposed in the same subpixel column may be coupled to the same ends of the vertical stem portions 193a and 193b.

As an example, in a first column of FIG. 7 where the plurality of pixel electrodes are disposed, the horizontal stem portions 194a and 194b coupled to the vertical stem portions 193a and 193b disposed in a left-side subpixel column are coupled to each of upper ends of the vertical stem portions 193a and 193b.

In addition, in a first column of FIG. 7 where the plurality of pixel electrodes are disposed, the horizontal stem portions 194a and 194b coupled to the vertical stem portions 193a and 193b disposed in a right-side subpixel column are coupled to each of lower ends of the vertical stem portions 193a and 193b.

The horizontal stem portions 194a and 194b in the left-side subpixel column and the right-side subpixel column included in each of the first and second subpixel electrodes are alternately disposed, and the horizontal stem portions 194a and 194b disposed in the same subpixel column are disposed to be coupled to the same ends of the vertical stem portions 193a and 193b.

Accordingly, the plurality of pixel areas according to the exemplary embodiment of the present inventive concept have shapes in which the pixel electrodes of the same configuration are disposed in the matrix form.

Shapes of pixel electrodes according to further exemplary embodiments of the present inventive concept will now be described with reference to FIGS. 8 to 14.

FIGS. 8 to 14 are layout views of a plurality of pixels according to the further exemplary embodiments of the present inventive concept.

Figure 8:
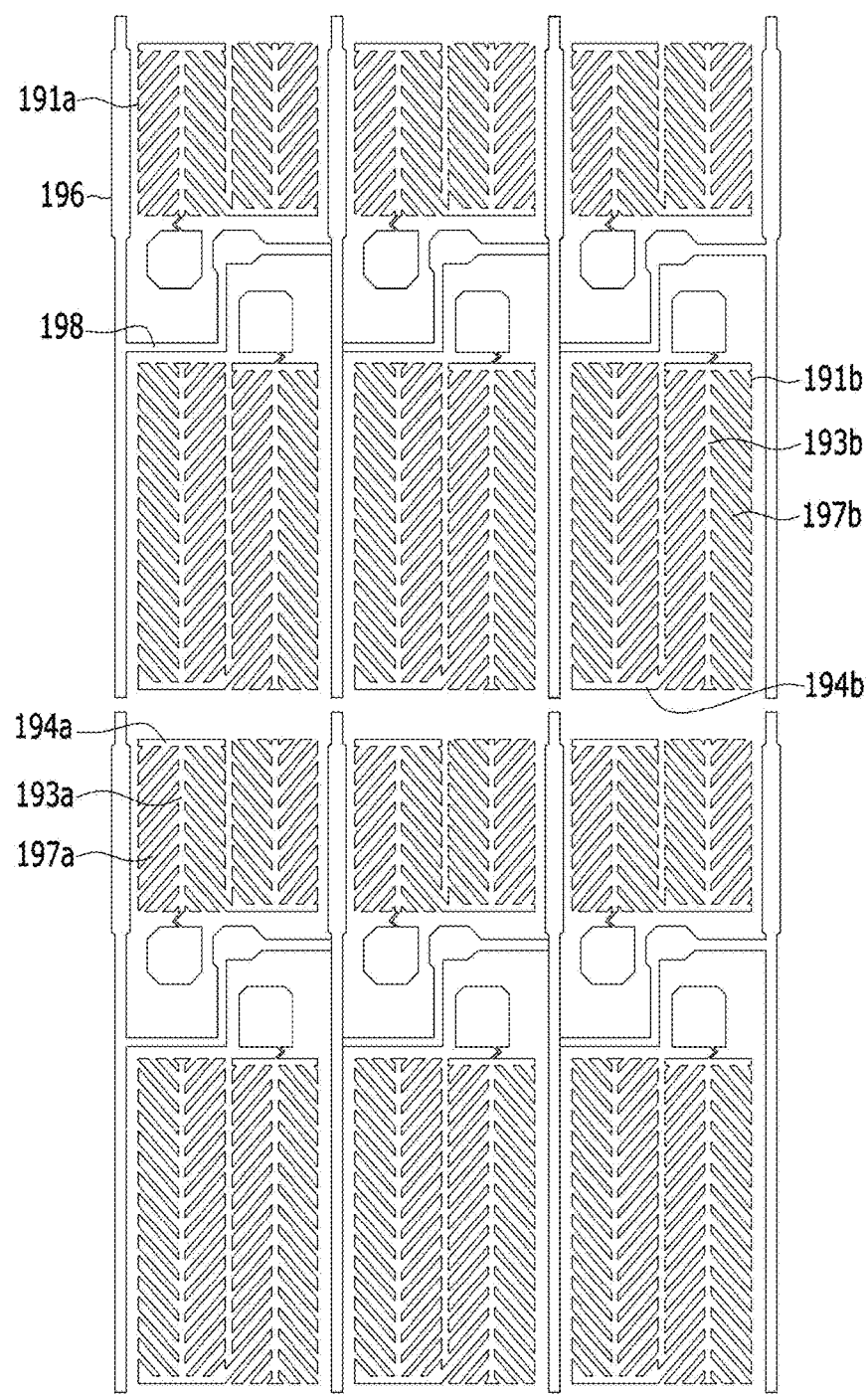
FIGS. 8, 9, 10, 11, 12, 13, and 14 are layout views of a plurality of pixels according to further exemplary embodiments of the present inventive concept.

Referring first to FIG. 8, in the current exemplary embodiment of the present inventive concept, a configuration of a first subpixel electrode 191a and a second subpixel electrode 191b are symmetrical with respect to the gate line 121.

Referring to one pixel electrode disposed in a first column of FIG. 8, a first horizontal stem portion 194a coupled to a first vertical stem portion 193a disposed in a left-side subpixel column is coupled to an upper end of the first vertical stem portion 193a, while a second horizontal stem portion 194b coupled to a second vertical stem portion 193b disposed in the left-side subpixel column of the same pixel electrode is coupled to a lower end of the second vertical stem portion 193b.

In addition, a first horizontal stem portion 194a coupled to a first vertical stem portion 193a disposed at a right-side subpixel column of the same pixel electrode is coupled to a lower end of the first vertical stem portion 193a, while a second horizontal stem portion 194b coupled to a second vertical stem portion 193b disposed in the right-side pixel column of the same pixel electrode is coupled to an upper end of the second vertical stem portion 193b.

That is, referring to one pixel electrode, the first subpixel electrode 191a and the second subpixel electrode 191b are formed such that the configuration of the first subpixel electrode 191a and the second subpixel electrode 191b are symmetrical to each other with respect to the gate line 121, and one pixel electrode including such a shape is repeated in the matrix form.

Figure 9:
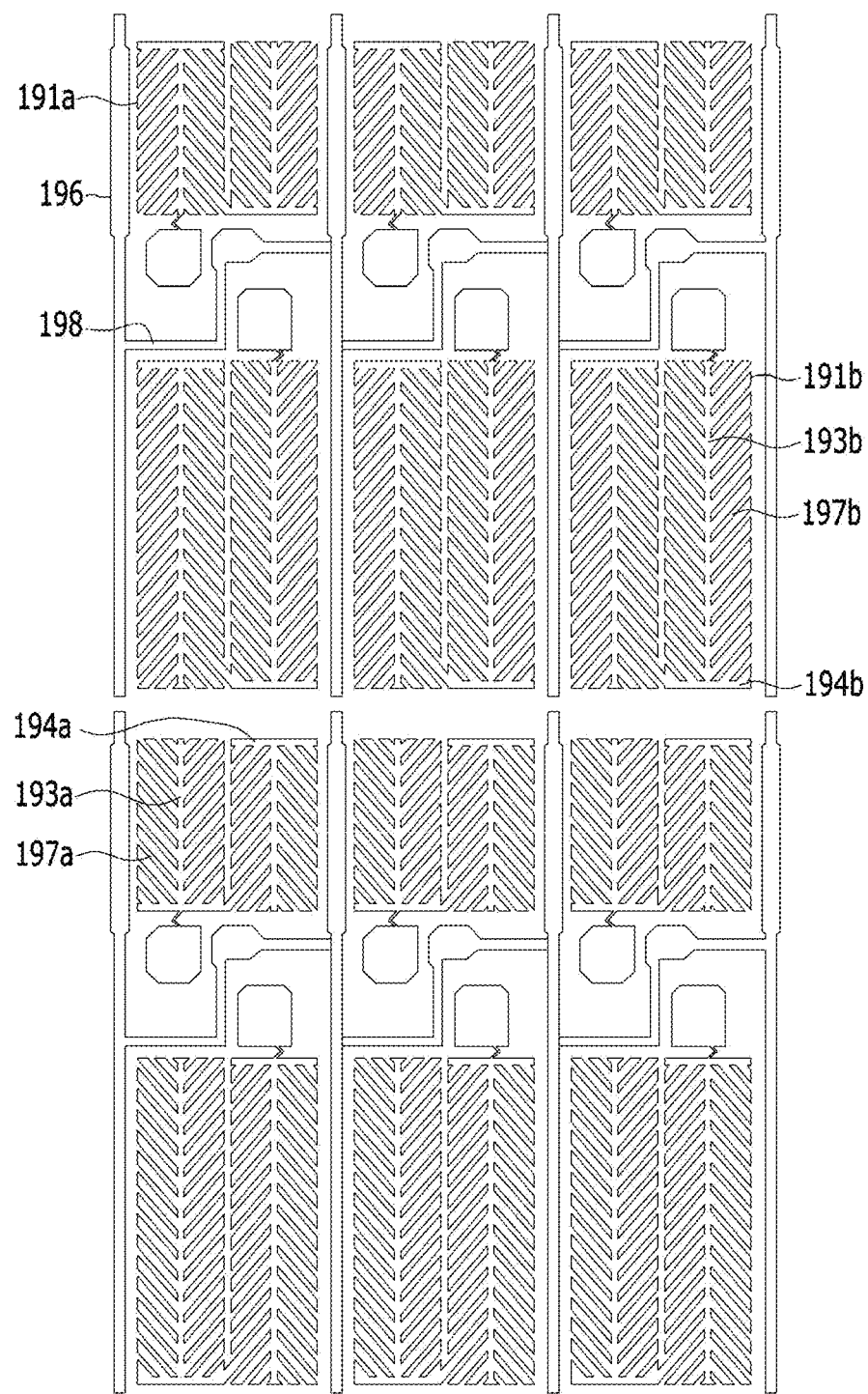

Next, referring to FIG. 9, pixel electrodes in the same row have the same configuration. Pixel electrodes adjacent to each other in the same column may have a configuration symmetrical to each other.

First, horizontal stem portions 194a and 194b disposed in the same row of one pixel electrode may be coupled to the same ends of vertical stem portions 193a and 193b.

Referring to FIG. 9, in the first row of pixel electrode, the horizontal stem portions 194a and 194b coupled to the vertical stem portions 193a and 193b disposed in a left-side subpixel column are coupled to each of upper ends of the vertical stem portions 193a and 193b, while the horizontal stem portions 194a and 194b coupled to the vertical stem portions 193a and 193b disposed in a right-side subpixel column are coupled to each of lower ends of the vertical stem portions 193a and 193b.

In the second row of pixel electrode, the horizontal stem portions 194a and 194b coupled to the vertical stem portions 193a and 193b disposed in the left-side subpixel column are coupled to each of the lower ends of the vertical stem portions 193a and 193b, while the horizontal stem portions 194a and 194b coupled to the vertical stem portions 193a and 193b disposed in the right-side subpixel column are coupled to each of the upper ends of the vertical stem portions 193a and 193b.

That is, positions of the horizontal stem portions in the adjacent pixel rows are disposed symmetrical to those of the horizontal stem portions of one pixel electrode described above.

Figure 10:
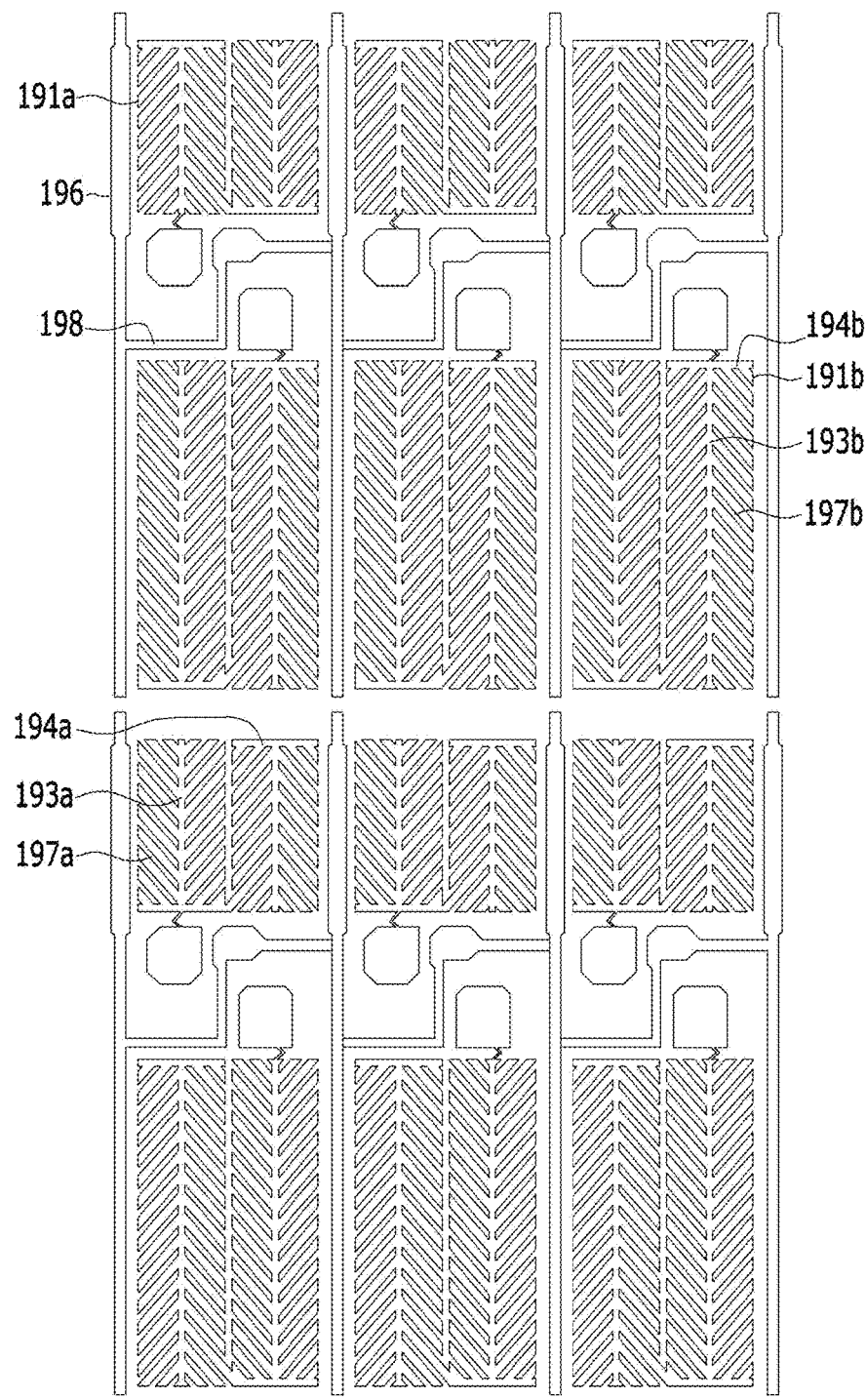

Next, referring to FIG. 10, a first horizontal stem portion 194a and a second horizontal stem portion 194b disposed in an n-th row and a first horizontal stem portion 194a and a second horizontal stem portion 194b disposed in an (n+1)-th row may be respectively coupled to the opposite ends of the first vertical stem portion 193a and the second vertical stem portion 193b.

Referring to FIG. 10, as in the exemplary embodiment of FIG. 8, in one pixel electrode, a configuration of a first subpixel electrode 191a and a second subpixel electrode 191b are formed to be symmetrical to each other with respect to the gate line 121.

Meanwhile, the second horizontal stem portion 194b disposed in a left-side subpixel column of the second subpixel electrode 191b is coupled to a lower end of the second vertical stem portion 193b, and in another pixel electrode adjacent in the column direction, the first horizontal stem portion 194a disposed in the left-side subpixel column of the first subpixel electrode 191a is coupled to the lower end of the first vertical stem portion 193a.

That is, in the pixel electrodes in the adjacent column, the second horizontal stem portion 194b of the n-th column and the first horizontal stem portion 194a of the (n+1)-th column that are disposed in the same subpixel column may be respectively coupled to the same ends of the vertical stem portions 193b and 193a.

In the pixel electrode disposed in the (n+1)-th row, a configuration of the first subpixel electrode 191a and the second subpixel electrode 191b are also disposed to be symmetrical to each other with respect to the gate line 121.

Figure 11:
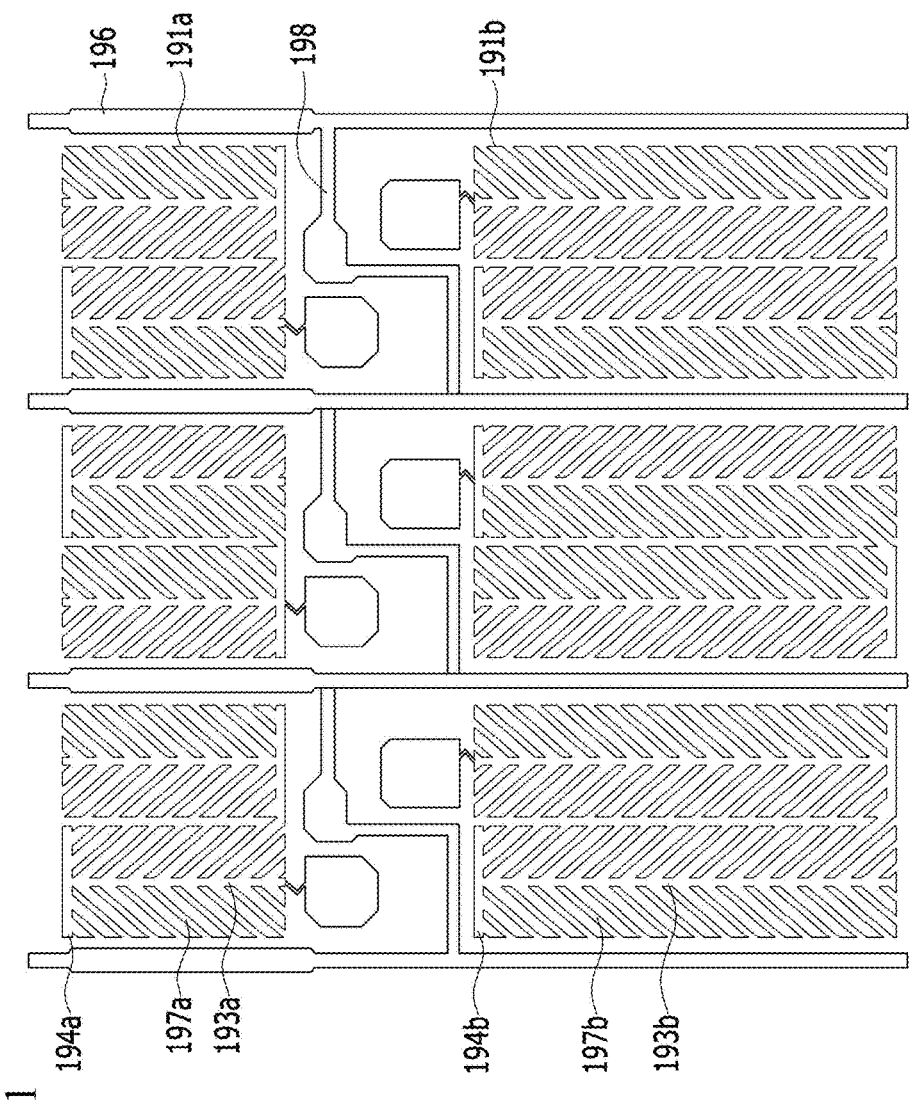

Next, referring to FIG. 11, shapes of pixel electrodes adjacent each other in a row direction are formed to be symmetrical to each other.

First, as in the exemplary embodiment illustrated in FIG. 7, in one pixel electrode illustrated in FIG. 11, horizontal stem portions 194a and 194b disposed in the same row are coupled to the same ends of vertical stem portions 193a and 193b.

In one pixel electrode disposed in a first column of FIG. 11, the horizontal stem portions 194a and 194b coupled to the vertical stem portions 193a and 193b disposed in a left-side subpixel column are coupled to each of upper ends of the vertical stem portions 193a and 193b, while in a plurality of pixel electrodes disposed in the first column of FIG. 11, the horizontal stem portions 194a and 194b coupled to the vertical stem portions 193a and 193b disposed in a right-side subpixel column are coupled to each of lower ends of the vertical stem portions 193a and 193b.

Meanwhile, the horizontal stem portions 194a and 194b disposed in a left-side subpixel column of another pixel electrode adjacent in the row direction are coupled to each of lower ends of the vertical stem portions 193a and 193b.

In addition, the horizontal stem portions 194a and 194b coupled to the vertical stem portions 193a and 193b disposed in a right-side subpixel column of the adjacent pixel electrode are coupled to each of upper ends of the vertical stem portions 193a and 193b.

In summary, in one pixel electrode, the plurality of horizontal stem portions 194a and 194b included in each of the left-side subpixel column and the right-side subpixel column are alternately disposed with respect to each other, and the horizontal stem portions 194a and 194b disposed in the same row are disposed such that they are coupled to the same ends of the vertical stem portions 193a and 193b.

In this case, the pixel electrodes adjacent in the row direction have shapes that are symmetrical to each other.

Figure 12:
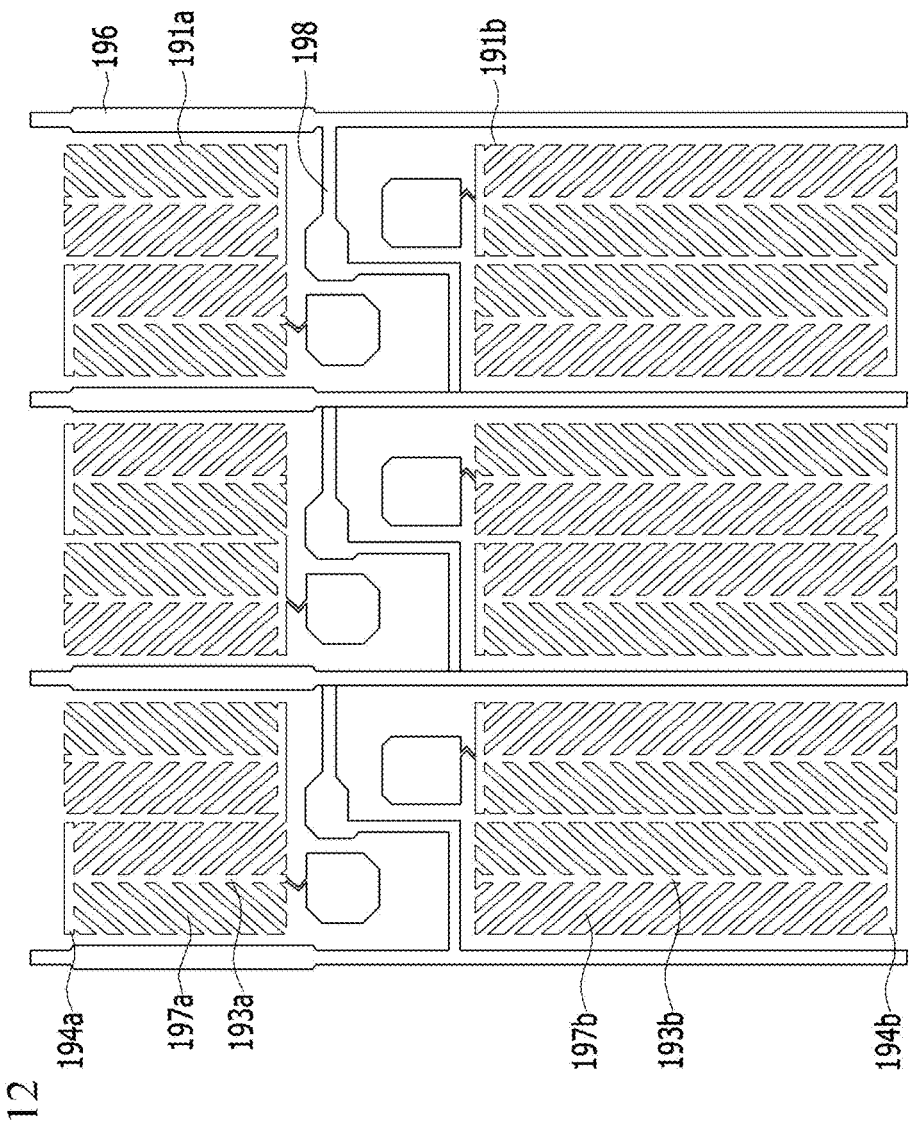

Next, referring to FIG. 12, similar to FIG. 11, pixel electrodes adjacent in the row direction have shapes that are symmetrical to each other.

First, in one pixel electrode disposed in a first column of FIG. 12, a first horizontal stem portion 194a coupled to a first vertical stem portion 193a disposed in a left-side subpixel column is coupled to an upper end of the first vertical stem portion 193a, while a second horizontal stem portion 194b coupled to a second vertical stem portion 193b disposed in a left-side subpixel column is coupled to a lower end of the second vertical stem portion 193b.

In addition, a first horizontal stem portion 194a coupled to a first vertical stem portion 193a disposed in a right-side pixel column is coupled to a lower end of the first vertical stem portion 193a, while in the same pixel electrode, a second horizontal stem portion 194b coupled to a second vertical stem portion 193b disposed in a right-side subpixel column is coupled to an upper end of the second vertical stem portion 193b.

That is, in one pixel electrode, a configuration of a first subpixel electrode 191a and a second subpixel electrode 191b are formed to be symmetrical to each other with respect to the gate line 121.

This is similar to the exemplary embodiment of FIG. 8.

In the exemplary embodiment of FIG. 12, the pixel electrodes adjacent in the row direction have the shapes that are symmetrical to each other with respect to the data line DL, and referring to one pixel electrode disposed in the first column, the first horizontal stem portion disposed in the left-side subpixel column is coupled to the upper end of the first vertical stem portion, while the first horizontal stem portion disposed in the right-side subpixel column is coupled to the lower end of the first vertical stem portion.

Referring to another pixel electrode adjacent in the row direction, the first horizontal stem portion disposed in the left-side subpixel column may be coupled to the lower end of the first vertical stem portion, while the first horizontal stem portion disposed in the left-side subpixel column may be coupled to the upper end of the first vertical stem portion.

This also applies to the second subpixel electrode.

In summary, FIGS. 11 and 12 illustrate the exemplary embodiments in which the pixel electrodes adjacent in the row direction are formed to be symmetrical to each other, and particularly, FIG. 12 illustrates the exemplary embodiment in which the first and second subpixel electrodes are symmetrical with respect to the gate line GL.

Figure 13:
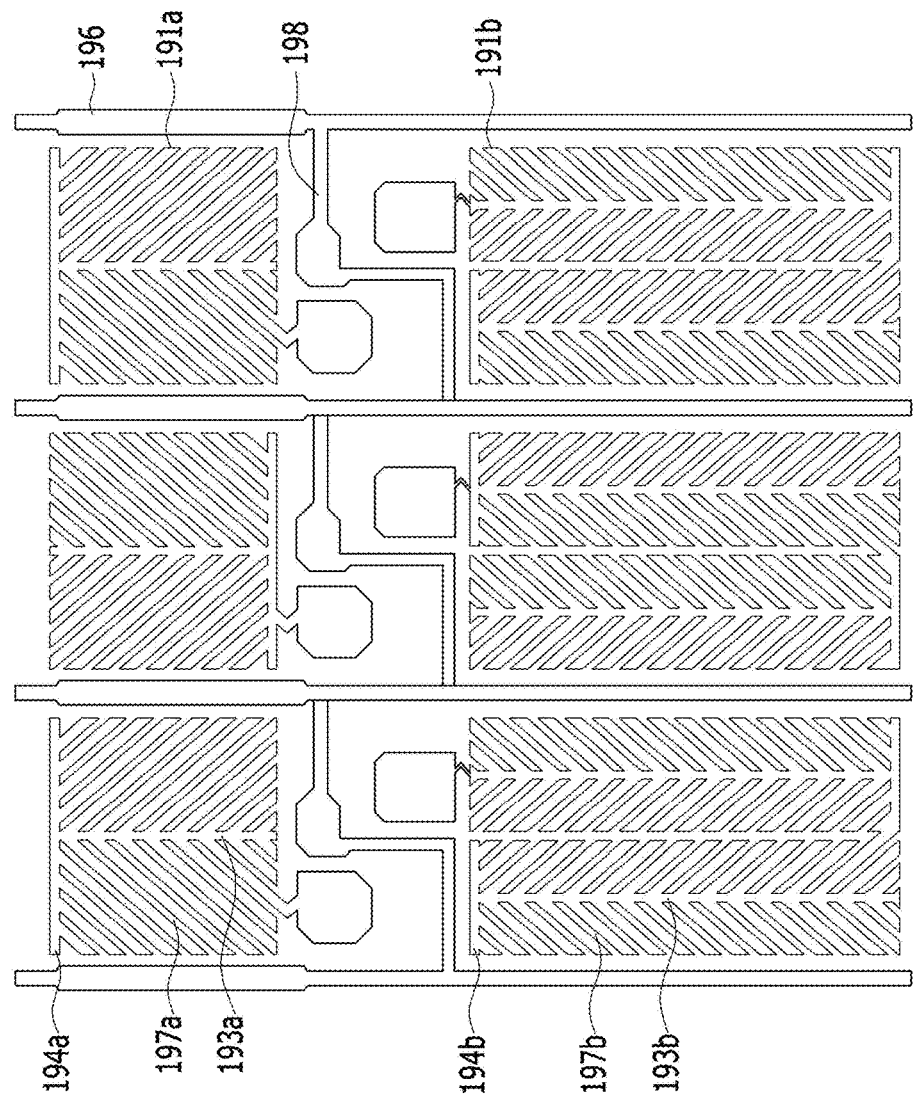

Next, referring to FIG. 13, the number of second horizontal stem portions 194b and the number of second vertical stem portions 193b that are included in a second subpixel electrode 191b may be greater than that of first horizontal stem portions 194a and that of first vertical stem portions 193a.

As an example, the first subpixel electrode 191a may include one first vertical stem portion 193a and one first horizontal stem portion 194a, while the second subpixel electrode 191b may include two second vertical stem portions 193b and two second horizontal stem portions 194b.

Specifically, the first subpixel electrode 191a includes one first vertical stem portion 193a and one first horizontal stem portion 194a, and one first horizontal stem portion 194a may be disposed at an end of the first vertical stem portion 193a to be perpendicular thereto.

The second subpixel electrode 191b may have a shape that is similar to that of the aforementioned exemplary embodiments.

The second subpixel electrode 191b includes two second vertical stem portions 193b and two second horizontal stem portions 194b, and the two second horizontal stem portions 194b may be disposed at different ends of the second vertical stem portion 193b.

That is, either one of the second horizontal stem portions 194b may be coupled to the upper end of the second vertical stem portion 193b, while the other one of the second horizontal stem portions 194b may be coupled to the lower end of the second vertical stem portion 193b.

That is, the plurality of second horizontal stem portions 194b may be alternately disposed with respect to each other, and four regions in which arrangements of liquid crystal molecules are respectively different may be formed.

Meanwhile, in the plurality of first subpixel electrodes 191a adjacent in the row direction, the four regions in which the arrangements of the liquid crystal molecules are respectively different may be formed.

Specifically, referring to one pixel electrode disposed in a first column of FIG. 13, the first horizontal stem portion 194a is coupled to the upper end of the first vertical stem portion 193a, and minute branch portions 197a disposed to a left side of the first vertical stem portion 193a align the liquid crystal molecules 31 in an upper right direction while minute branch portions 197a disposed at a right side of the first vertical stem portion 193a align the liquid crystal molecules 31 in an upper left direction.

In another pixel electrode adjacent to one pixel electrode disposed in the first row, the first horizontal stem portion 194a is coupled to the lower end of the first vertical stem portion 193a.

In this case, the minute branch portions 197a disposed at a left side of the first vertical stem portion 193a align the liquid crystal molecules 31 in a lower right direction, while the minute branch portions 197a disposed at a right side of the first vertical stem portion 193a align the liquid crystal molecules 31 in a lower left direction.

Accordingly, according to the exemplary embodiment as shown in FIG. 13, one first subpixel electrode 191a may include two regions in which the arrangements of the liquid crystal molecules 31 are respectively different, and may include four regions, between the plurality of first subpixel electrodes 191a adjacent in the column direction, in which the arrangements of the liquid crystal molecules 31 are respectively different.

Figure 14:
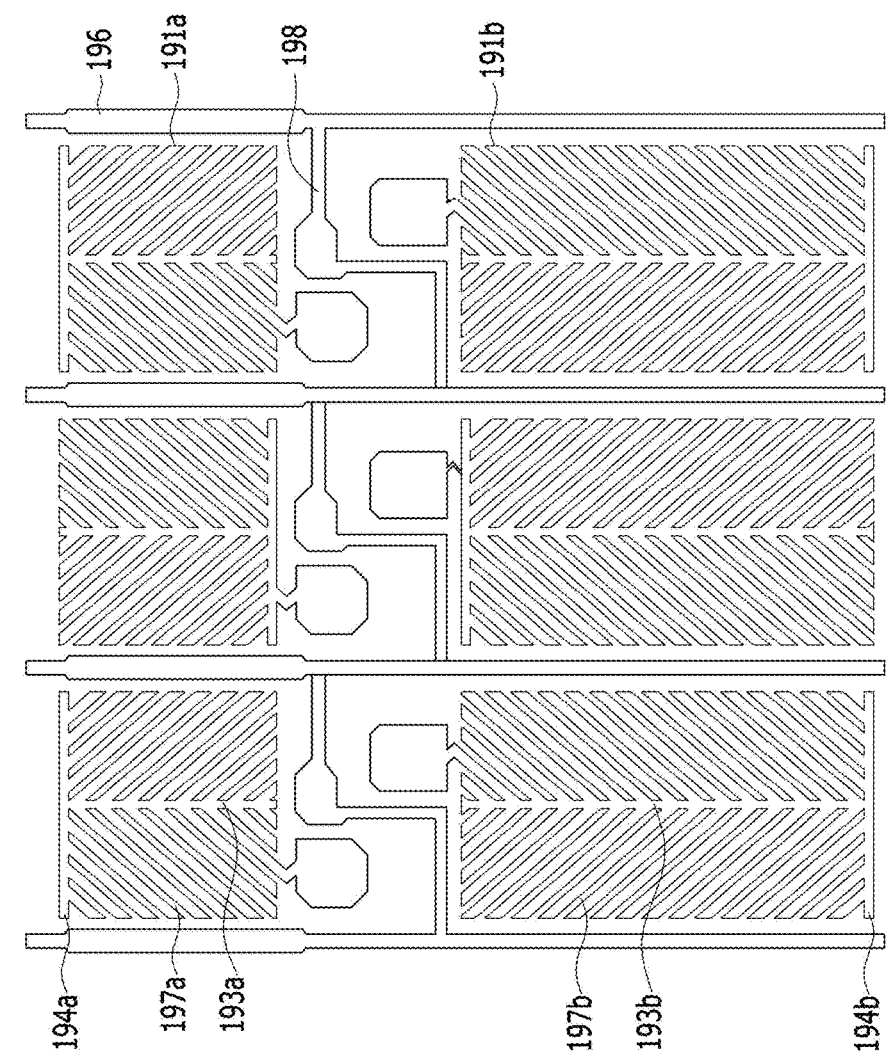

Next, referring to FIG. 14, a first subpixel electrode 191a may include one first vertical stem portion 193a and one first horizontal stem portion 194a, and the second subpixel electrode 191b may also include one second vertical stem portion 193b and one second horizontal stem portion 194b.

Since the first subpixel electrode 191a according to the exemplary embodiment of FIG. 14 is identical to the first subpixel electrode 191a according to the exemplary embodiment of FIG. 13, a repeated description will be omitted.

A second subpixel electrode 191b may include one second vertical stem portion 193b and one second horizontal stem portion 194b, and one second horizontal stem portion 194b may be disposed at an end of the second vertical stem portion 193b to be perpendicular thereto.

Referring to one pixel electrode disposed in a first column of FIG. 14, the second horizontal stem portion 194b is coupled to a lower end of the second vertical stem portion 193b, the second minute branch portions 197b disposed at a left side of the second vertical stem portion 193b align the liquid crystal molecules 31 in a lower right direction, while the second minute branch portions 197b disposed at a right side of the second vertical stem portion 193b align the liquid crystal molecules 31 in a lower left direction.

In another pixel electrode adjacent to one pixel electrode disposed in the first row, the second horizontal stem portion 194b is coupled to an upper end of the second vertical stem portion 193b.

In this case, the minute branch portions 197b disposed at a left side of the second vertical stem portion 193b align the liquid crystal molecules 31 in an upper right direction, while the minute branch portions disposed at a right side of the second vertical stem portion 193b align the liquid crystal molecules 31 in an upper left direction.

Accordingly, according to the current exemplary embodiment of FIG. 14, one second subpixel electrode 191b may include two regions in which the arrangements of the liquid crystal molecules 31 are respectively different, and the plurality of second subpixel electrodes 191b adjacent in the column direction may include two regions in which the arrangements of the liquid crystal molecules 31 are respectively different.

As described above, the structures in which the pixel electrodes including the vertical stem portions are vertically symmetrical, horizontally symmetrical, and alternately arranged, but they are not limited thereto, and a combination of the aforementioned exemplary embodiments may also be possible.

FIGS. 15 to 18 are circuit diagrams of one pixel according to further exemplary embodiments of the present inventive concept.

Figure 16:
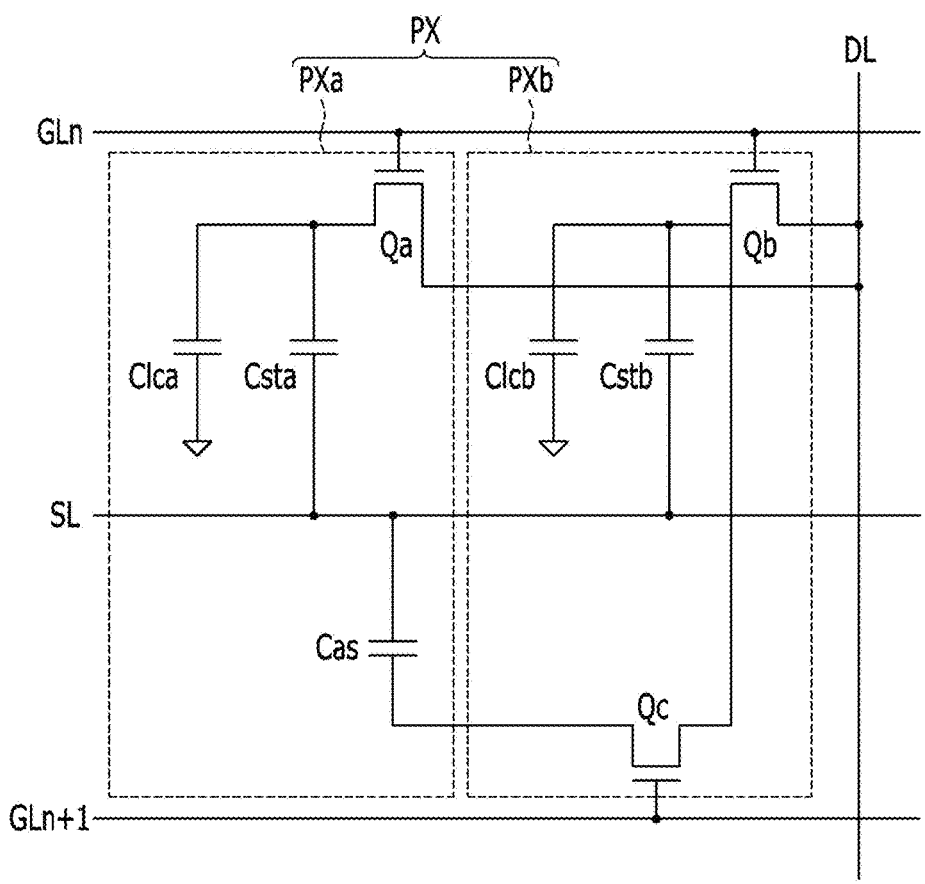
Figure 17:
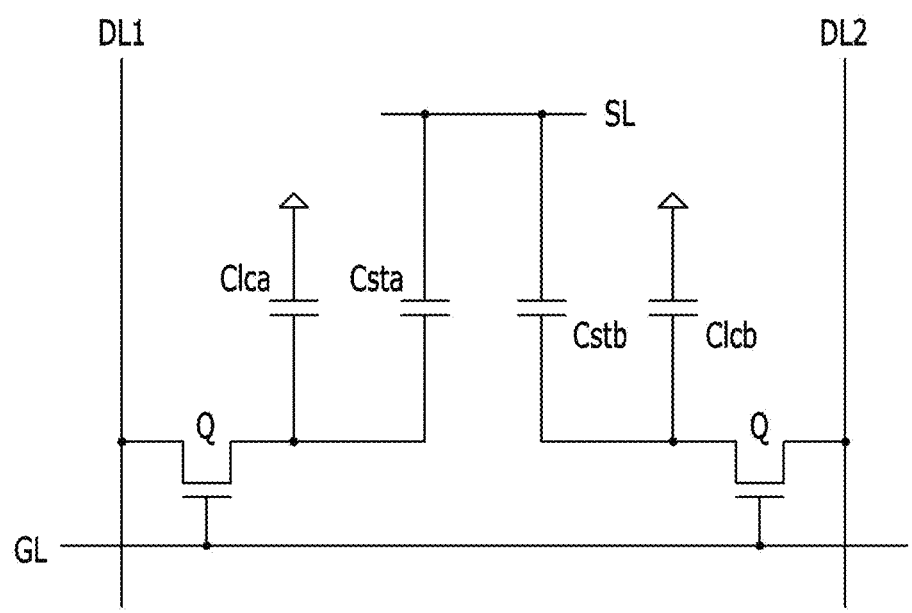
Figure 18:
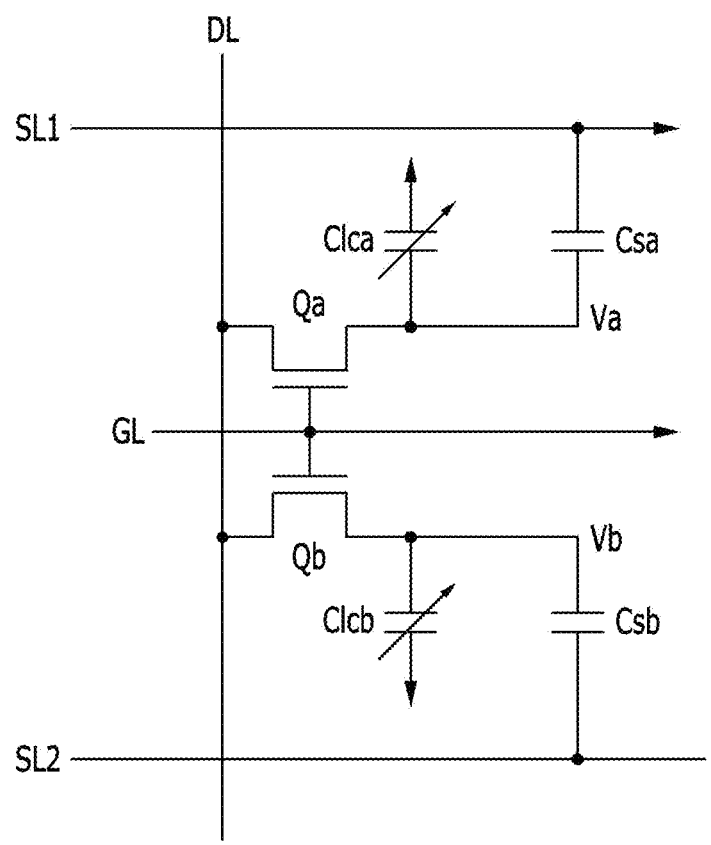

The shapes of the gate line and the data line illustrated in FIGS. 2 to 5 may be modified as shown in FIG. 18, which represents that the pixel arrangements of FIGS. 15 to 18 having the aforementioned shape of the pixel electrode are also possible.

Figure 15:
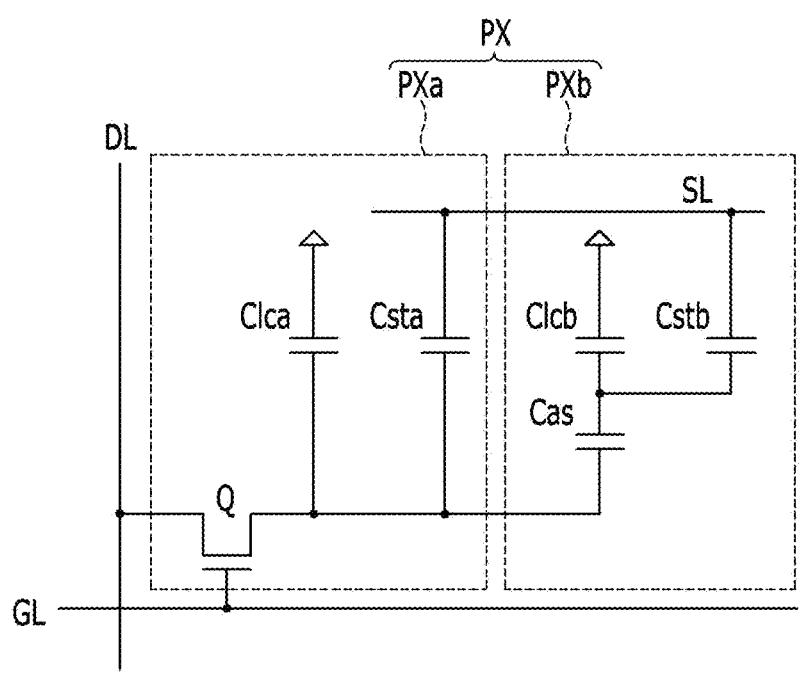
FIGS. 15, 16, 17, and 18 are circuit diagrams of one pixel according to further exemplary embodiments of the present inventive concept.

An exemplary embodiment of FIG. 15 will now be described.

An LCD according to the exemplary embodiment of the present inventive concept includes: signal lines including a plurality of gate lines GL, a plurality of data lines DL, and a plurality of storage electrode lines SL; and a plurality of pixels PXs coupled thereto.

Each pixel PX includes a pair of first and second subpixels PXa and PXb, and a first subpixel electrode is formed in the first subpixel PXa while a second subpixel electrode is formed in the second subpixel PXb.

The LCD according to the exemplary embodiment of the present inventive concept further includes: a switching element Q coupled to the gate line GL and the data line DL; a first storage capacitor Csta and a first liquid crystal capacitor Clca that are coupled to the switching element Q to be formed in the first subpixel PXa; a second liquid crystal capacitor Clcb and a second storage capacitor Cstb that are coupled to the switching element Q to be formed in the second subpixel PXb; and an auxiliary capacitor Cas that is formed between the switching element Q and the second liquid crystal capacitor Clcb.

The switching element Q is a three-terminal element such as a thin film transistor and the like that is provided in a lower panel, a control terminal thereof is coupled to the gate line GL, an input terminal thereof is coupled to the data line DL, and an output terminal thereof is coupled to the first liquid crystal capacitor Clca, the first storage capacitor Csta, and the auxiliary capacitor Cas.

One terminal of the auxiliary capacitor Cas is coupled to the output terminal of the switching element Q, while the other terminal thereof is coupled to the second liquid crystal capacitor Clcb and the second storage capacitor Cstb.

A charged voltage of the second liquid crystal capacitor Clcb is decreased by the auxiliary capacitor Cas such that it is lower than a charged voltage of the first liquid crystal capacitor Clca, thereby improving side visibility of the LCD.

An exemplary embodiment of FIG. 16 will now be described.

An LCD according to the exemplary embodiment of the present inventive concept includes: signal lines including a plurality of gate lines GLn and GL(n+1), a plurality of data lines DL, and a plurality of storage electrode lines SL; and a plurality of pixels PXs coupled thereto.

Each pixel PX includes a pair of first and second subpixels PXa and PXb, a first subpixel electrode is formed in the first subpixel PXa, while a second subpixel electrode is formed in the second subpixel PXb.

The LCD according to the exemplary embodiment of the present inventive concept includes: a first switching element Qa and a second switching element Qb that are coupled to the gate line GLn and the data line DL; a first liquid crystal capacitor Clca and a first storage capacitor Csta that are coupled to the first switching element Qa to be formed in the first subpixel PX; a second liquid crystal capacitor Clcb and a second storage capacitor Cstb that are coupled to the second switching element Qb to be formed in the second subpixel; a third switching element Qc that is coupled to the second switching element Qb to be switched by the next gate line GL(n+1); and an auxiliary capacitor Cas that is coupled to the third switching element Qc.

The first and second switching elements Qa and Qb are three-terminal elements such as a thin film transistor and the like that are provided in a lower panel, control terminals thereof are coupled to the gate line GLn, input terminals thereof are coupled to the data line DL, and output terminals thereof are respectively coupled to the first liquid crystal capacitor Clca and the first storage capacitor Csta as well as the second liquid crystal capacitor Clcb and the second storage capacitor Cstb.

The third switching element Qc is also a three-terminal element such as a thin film transistor and the like that is provided in the lower panel, a control terminal thereof is coupled to the next gate line GL(n+1), an input terminal thereof is coupled to the second liquid crystal capacitor Clcb, and an output terminal thereof is coupled to the auxiliary capacitor Cas.

One terminal of the auxiliary capacitor Cas is coupled to the output terminal of the third switching element Qc, while the other terminal thereof is coupled to the storage electrode line SL.

An operation of the LCD according to the exemplary embodiment of the present inventive concept will now be described. When a gate-on voltage is applied to the gate line GLn, the first and second switching elements Qa and Qb connected thereto are turned on, and a data voltage of the data line DL is applied to the first and second subpixel electrodes.

Next, when a gate-off voltage is applied to the gate line GLn and the gate-on voltage is then applied to the next gate line GL(n+1), the first and second switching elements Qa and Qb are turned off and the third switching element Qc is turned on.

Accordingly, charges of the second subpixel electrode coupled to the output terminal of the second switching element Qb flow into the auxiliary capacitor Cas, thereby causing the voltage of the second liquid crystal capacitor Clcb to be decreased.

As such, the charged voltages of the first and second liquid crystal capacitors Clca and Clcb can be differently set to improve side visibility of the liquid crystal display.

An exemplary embodiment of FIG. 17 will now be described.

An LCD according to the exemplary embodiment of the present inventive concept includes: signal lines including a plurality of gate lines GL, a plurality of data lines DL1 and DL2, and a plurality of storage electrode lines SL; and a plurality of pixels PX coupled thereto.

Each pixel PX includes a pair of first and second liquid crystal capacitors Clca and Clab, and first and second storage capacitors Csta and Cstb.

Each subpixel includes one liquid crystal capacitor and one storage capacitor, and additionally includes one thin film transistor.

The thin film transistors Q of the two subpixels included in one pixel are coupled to the same gate line GL but are respectively coupled to the different data lines DL1 and DL2.

Data voltages of different levels are simultaneously applied to the different data lines DL1 and DL2 such that the first and second liquid crystal capacitors Clca and Clcb of the two subpixels have the different charged voltages.

Thus, side visibility of the LCD can be improved.

An exemplary embodiment of FIG. 18 will now be described.

As shown in FIG. 18, an LCD according to the exemplary embodiment of the present inventive concept includes: a gate line GL; a data line DL; a first power line SL1; a second power line SL2; and a first switching element Qa and a second switching element Qb that are coupled to the gate line GL and the data line DL.

The LCD according to the exemplary embodiment of the present inventive concept further includes an auxiliary step-up capacitor Csa and a first liquid crystal capacitor Clca that are coupled to the first switching element Qa, and an auxiliary step-down capacitor Csb and a second liquid crystal capacitor Clcb that are coupled to the second switching element Qb.

The first and second switching elements Qa and Qb are three-terminal elements such as a thin film transistor and the like.

The first and second switching elements Qa and Qb are coupled to the same gate and data lines GL and DL to be turned on at the same time, thereby outputting the same data signal.

The first and second power lines SL1 and SL2 are applied with a voltage that can be swung for a predetermined period.

A first low voltage is applied to the first power line SL1 for the predetermined period (e.g., 1H), and a first high voltage is applied thereto for the next predetermined period.

A second high voltage is applied to the second power line SL2 for the predetermined period, and a second low voltage is applied thereto for the next predetermined period.

In this case, the first period and the second period are repeated multiple times in one frame such that the voltage that is swung is applied to the first and second power lines SL1 and SL2.

In this case, the first low voltage and the second low voltage may be identical to each other, and the first high voltage and the second high voltage may also be identical to each other.

The auxiliary step-up capacitor Csa is coupled to the first switching element Qa and the first power line SL1, and the auxiliary step-down capacitor Csb is coupled to the second switching element Qb and the second power line SL2.

A voltage Va of a terminal (hereinafter referred to as a "first terminal") of a part of the auxiliary step-up capacitor Csa coupled to the first switching element Qa is decreased when the first low voltage is applied to the first power line SL1, and is increased when the first high voltage is applied thereto.

Subsequently, as the voltage of the first power line SL1 is swung, the voltage Va of the first terminal is also swung.

In addition, a voltage Vb of a terminal (hereinafter referred to as a "second terminal") of a part of the auxiliary step-down capacitor Csb coupled to the second switching element Qb is increased when the second high voltage is applied to the second power line SL2, and is decreased when the second low voltage is applied thereto.

Subsequently, as the voltage of the second power line SL2 is swung, the voltage Vb of the second terminal is also swung.

As such, even if the same data voltage is applied to the two subpixels, the voltages Va and Vb of the pixel electrodes of the two subpixels are changed depending on the swung voltages of the first and second power line SL1 and SL2, thereby improving side visibility as well as making transmittances of the two subpixels different.

In the exemplary embodiments of FIGS. 15 to 18, a reference voltage line is not used, but any line parallel to the data line is formed to traverse a center of a display area of a pixel, thereby improving display quality.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A display device comprising:
   a first insulation substrate;
   a gate line and a data line insulating each other;
   a thin film transistor disposed on the first insulation substrate;
   a pixel electrode coupled to the thin film transistor;
   a second insulation substrate facing the first insulation substrate; and
   a common electrode disposed on the second insulation substrate,
   wherein the pixel electrode includes:
   a first subpixel electrode including a first vertical stem portion and a first horizontal stem portion that is disposed perpendicular to the first vertical stem portion at an end of the first vertical stem portion, and
   a second subpixel electrode including a second vertical stem portion and a second horizontal stem portion that is disposed perpendicular to the second vertical stem portion at an end of the second vertical step portion,
   wherein the first subpixel electrode comprises a plurality of the first vertical stem portions and the plurality of the first vertical stem portions overlap each other along an extending direction of the gate line in a plan view.

2. The display device of claim 1, wherein the display device is a curved display device having curved edges along a short-side direction of the display device.

3. The display device of claim 2, wherein the first vertical stem portion, the second vertical stem portion, and the short sides are parallel to each other.

4. The display device of claim 2, wherein the pixel electrode further comprising first minute branch portions extending from the first vertical stem portion and the first horizontal stem portion, and second minute branch portions extending from the second vertical stem portion and the second horizontal stem portion.

5. The display device of claim 2, wherein the first subpixel electrode includes a plurality of subpixel columns each having a first horizontal stem portion and a first vertical stem portion, and
   wherein first horizontal stem portions in adjacent subpixel columns are connected to opposite ends of first vertical stem portions, respectively.

6. The display device of claim 5, further comprising a second pixel electrode disposed adjacent to the pixel electrode along the extending direction of the gate line,
   wherein the second pixel electrode includes a plurality of subpixel columns each having a second horizontal stem portion and the second vertical stem portion, and
   wherein second horizontal stem portions in adjacent subpixel columns are connected to opposite ends of second vertical stem portions, respectively.

7. The display device of claim 2, wherein two pixel electrodes adjacent in a row direction are symmetrical to each other.

8. The display device of claim 2, wherein a configuration of two pixel electrodes adjacent in a column direction are symmetrical to each other.

9. The display device of claim 2, wherein the second horizontal stem portion disposed in an n-th row of the same column and the first horizontal stem portion disposed in an (n+1)-th row of the same column are coupled to the same ends of the second vertical stem portion and the first vertical stem portion.

10. The display device of claim 1, further comprising first minute branch portions extending from the first vertical stem portion and the first horizontal stem portion, and second minute branch portions extending from the second vertical stem portion and the second horizontal stem portion.

11. The display device of claim 1, wherein the first subpixel electrode includes a plurality of subpixel columns each having a first horizontal stem portion and a first vertical stem portion, and
    wherein first horizontal stem portions in adjacent subpixel columns are connected to opposite ends of first vertical stem portions, respectively.

12. The display device of claim 11, wherein the second pixel electrode includes a plurality of subpixel columns each having a second horizontal stem portion and a second vertical stem portion, and wherein second horizontal stem portions in adjacent subpixel columns are connected to opposite ends of second vertical stem portions, respectively.

13. The display device of claim 12, wherein the first and second horizontal stem portions disposed in the same subpixel column are coupled to the same ends of the first vertical stem portion and the second vertical stem portion.

14. The display device of claim 11, wherein the thin film transistor includes:

a gate line disposed on the first insulation substrate; a semiconductor layer disposed on the gate line; and a data line disposed on the semiconductor layer and including a source electrode and a drain electrode, wherein the first and second subpixel electrodes are disposed to be separated from each other with respect to the gate line, and a configuration of the first and second horizontal stem portions are symmetrically disposed with respect to the gate line.

15. The display device of claim 1, wherein two pixel electrodes adjacent in a row direction are symmetrical to each other.

16. The display device of claim 1, wherein a configuration of two pixel electrodes adjacent in a column direction are symmetrical to each other.

17. The display device of claim 1, wherein the second horizontal stem portion disposed in an n-th row of the same column and the first horizontal stem portion disposed in an (n+1)-th row of the same column are coupled to the same ends of the second vertical stem portion and the first vertical stem portion.

18. The display device of claim 1, wherein the number of the second horizontal stem portions is greater than that of the first horizontal stem portions.

19. The display device of claim 1, wherein the first subpixel electrode includes one first horizontal stem portion, and the first horizontal stem portion of the pixel electrode adjacent in a row direction is connected to a different end of the first vertical stem portion.

20. The display device of claim 19, wherein the second subpixel electrode includes one second horizontal stem portion, and the second horizontal stem portion of the pixel electrode adjacent in the row direction is connected to a different end of the second vertical stem portion.

* * * * *